US008450995B2

(12) United States Patent
Wagner

(10) Patent No.: US 8,450,995 B2
(45) Date of Patent: May 28, 2013

(54) METHOD AND APPARATUS FOR MONITORING POWER CONSUMPTION

(75) Inventor: Charles G. Wagner, Milford, DE (US)

(73) Assignee: Powerkuff, LLC, Milton, DE (US)

( * ) Notice: Subject to any disclaimer, the term of this patent is extended or adjusted under 35 U.S.C. 154(b) by 507 days.

(21) Appl. No.: 12/451,791

(22) PCT Filed: May 30, 2008

(86) PCT No.: PCT/US2008/006871
§ 371 (c)(1), (2), (4) Date: Dec. 1, 2009

(87) PCT Pub. No.: WO2008/150458
PCT Pub. Date: Dec. 11, 2008

(65) Prior Publication Data
US 2010/0167659 A1    Jul. 1, 2010

Related U.S. Application Data

(60) Provisional application No. 60/924,833, filed on Jun. 1, 2007.

(51) Int. Cl.
*G01R 11/32* (2006.01)
(52) U.S. Cl.
USPC ......... 324/142; 324/126; 324/127; 455/67.11
(58) Field of Classification Search
USPC ................. 324/117 R, 117 H, 126, 127, 142; 340/870.02; 455/67.11; 336/176
See application file for complete search history.

(56) References Cited

U.S. PATENT DOCUMENTS

| 4,644,320 A | 2/1987 | Carr et al. |
| 4,717,872 A | 1/1988 | Wagner et al. |
| 4,754,218 A | 6/1988 | Wagner et al. |

(Continued)

FOREIGN PATENT DOCUMENTS
WO   PCT/US2008/006871        5/2008

OTHER PUBLICATIONS

William Feldman; "Metering, Monitoring, Managing Energy Costs" web site: FacilityZone: The Search Engine for Facility Professionals; Aug. 24, 2006; pp. 1-6.

(Continued)

*Primary Examiner* — Arleen M Vazquez
(74) *Attorney, Agent, or Firm* — William L. Klima; Vorys, Sater, Seymour and Pease LLP

(57) ABSTRACT

A power consumption monitor, system, and method for monitoring power consumed by equipment, appliances, devices, buildings, and campuses is accomplished by passive sensors (12, 40) that detect power transmitted by individual conductors (C), and which include a current to voltage transformer with a passive, open-circuit electromagnetic force concentrator (22) positioned near the conductor (C). The sensor (22) generates an amplitude signal proportional to the power passing through the conductor (C). Programmable radios on a chip (32, 62, 72) and systems on a chip (34, 64, 74) are used to transmit the amplitude signal to a monitor (50) that displays the power being consumed along with actual and estimated cost and historical information. Software programs are implemented across the sensors (12, 40) and monitors (50) and a remote computer (80) to enable real-time monitoring power consumption with a resolution that spans from entire campuses down to single devices.

25 Claims, 18 Drawing Sheets

U.S. PATENT DOCUMENTS

| | | | |
|---|---|---|---|
| 5,594,332 A | 1/1997 | Harman et al. | |
| 6,839,597 B2 | 1/2005 | Hattori et al. | |
| 7,043,380 B2 | 5/2006 | Rodenberg, III et al. | |
| 7,622,912 B1 * | 11/2009 | Adams et al. | 324/764.01 |
| 8,125,214 B1 * | 2/2012 | Steingart et al. | 324/117 H |
| 2002/0149377 A1 | 10/2002 | Hefti et al. | |
| 2003/0126475 A1 | 7/2003 | Bodas | |
| 2006/0103549 A1 * | 5/2006 | Hunt et al. | 340/870.02 |
| 2007/0007968 A1 * | 1/2007 | Mauney et al. | 324/538 |
| 2008/0106434 A1 * | 5/2008 | Winter | 340/870.2 |
| 2010/0283577 A1 * | 11/2010 | Koch | 340/5.2 |
| 2010/0301837 A1 * | 12/2010 | Higuma et al. | 324/140 R |
| 2012/0248936 A1 * | 10/2012 | Hsieh et al. | 310/339 |

OTHER PUBLICATIONS

Centameter: think green; dated Jan. 19, 2007; web site: www. Centameter. Com. Au/faqs. htm.

\* cited by examiner

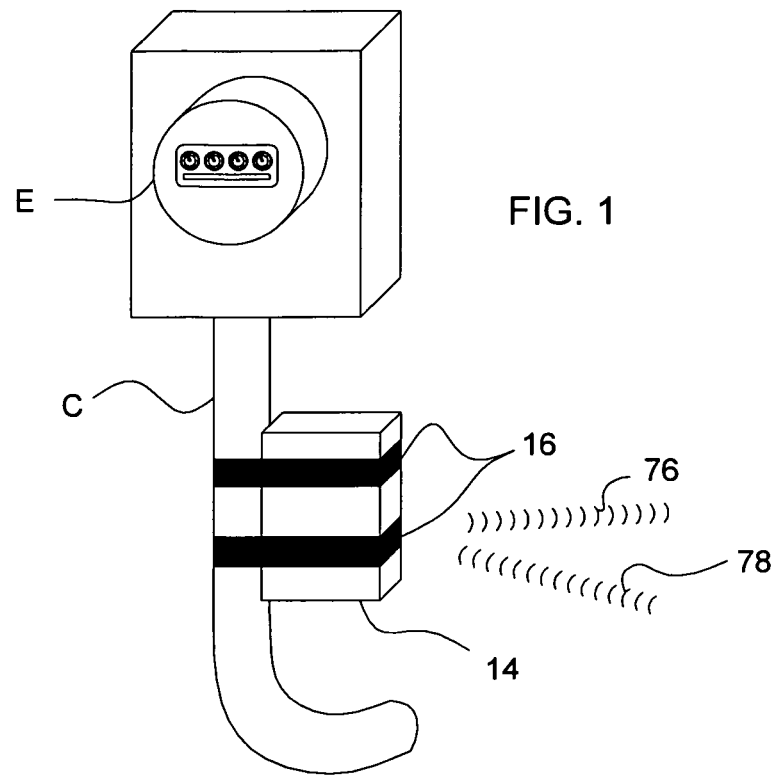
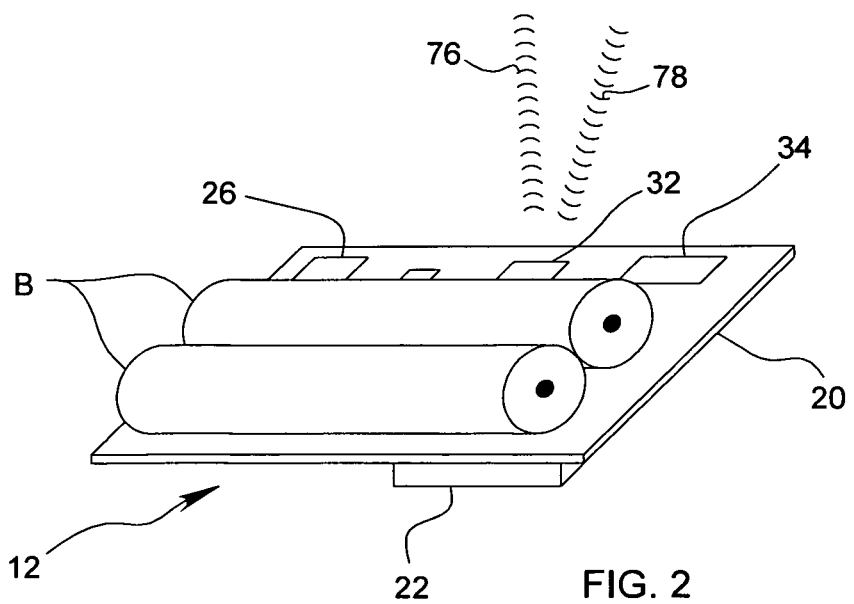

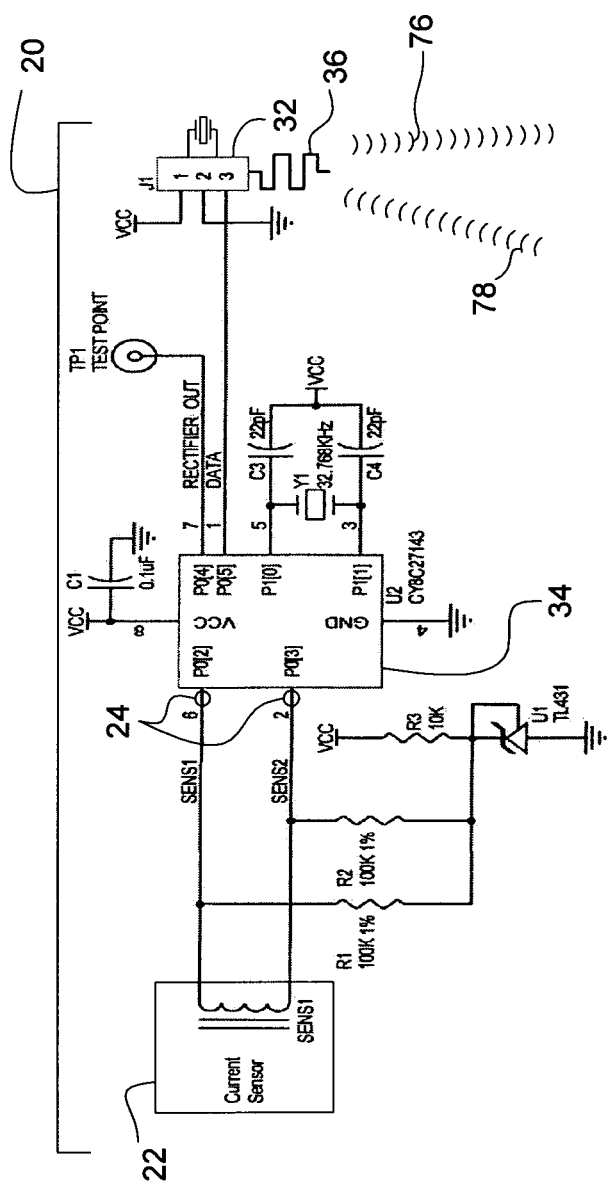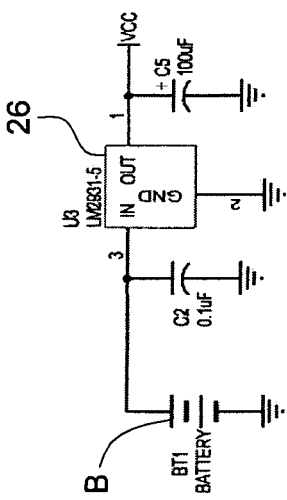
FIG. 3

Continue-A

Continue-B

Continue-A

| KW IN USE NOW | 1.124 | MONEY PER DAY |
| | | 4.6 |
| | | THIS MONTH'S PROJECTED BILL |
| | | $135.00 |

KWHR THIS MONTH [462]　　KWH THIS YEAR [1243]　　SET UP ALARM

BOOSTER SIGNAL STRENGTH [　　　　]

APPLIANCE MENU [FURNACE ▼]　KWHR THIS MONTH [!00]　SET UP ALARM
　　REFRIGERATOR
　　DISHWASHER
　　TV1　　　　　　　KWHR THIS YEAR [432]
　　TV2
MY ELECTRIC BILL (KWH)　FURNACE　　COST [　　]
　　　　　　　　　　2ND FLOOR ELECTRIC H
ELECTRIC BILL START DATE　FIRST FLOOR LIGHTS　END DATE [　　]　[SAVE]

LOW BATTERY　○ POWERKUFF SENSOR　○ POWERKUFF DISPLAY　APPLIANCE [　　]

[USER MANUAL]　[POWERKUFF.COM]　[GRAPHS AND CHARTS]　[END SESSION]

FIG. 10

| SELECT ELECTRIC BILL START DATE ||||||||
|---|---|---|---|---|---|---|---|
| FEB 2007 ||| FEB ||| 2007 ||
| SUN | MON | TUE | WED | THU | FRI | SAT ||
| 28 | 29 | 30 | 31 | 1 | 2 | 3 ||
| 4 | 5 | 6 | 7 | 8 | 9 | 10 ||
| 11 | 12 | 13 | 14 | 15 | 16 | 17 ||
| 18 | 19 | 20 | 21 | 22 | 23 | 24 ||
| 25 | 26 | 27 | 28 | 1 | 2 | 3 ||
| 4 | 5 | 6 | 7 | 8 | 9 | 10 ||

| SELECT ELECTRIC BILL END DATE ||||||||
|---|---|---|---|---|---|---|---|
| FEB 2007 ||| FEB ||| 2007 ||
| SUN | MON | TUE | WED | THU | FRI | SAT ||
| 28 | 29 | 30 | 31 | 1 | 2 | 3 ||
| 4 | 5 | 6 | 7 | 8 | 9 | 10 ||
| 11 | 12 | 13 | 14 | 15 | 16 | 17 ||
| 18 | 19 | 20 | 21 | 22 | 23 | 24 ||
| 25 | 26 | 27 | 28 | 1 | 2 | 3 ||
| 4 | 5 | 6 | 7 | 8 | 9 | 10 ||

*FIG. 11*

| Power Equivalents In Use: | | % RELIABILITY: | |
|---|---|---|---|
| KW IN USE: | | MONEY / DAY: | |
| KWH Used This Month: | | MONEY / MONTH: (Projected Bill) | |
| KWH USED THIS YEAR: From Bills | | | Setup Alarm |

| Device #1 | o | Install Date: | | NAME: Furnace | * | |
|---|---|---|---|---|---|---|
| Device #2 | o | Install Date: | | NAME: TV1 | * | |
| Device #3 | o | Install Date: | | NAME: Refrig. | * | Save |

| KWH Used This Month: Appliance #: | | KWH This Year: | | Setup Alarm |
|---|---|---|---|---|
| My Electric Bill (KWH): | | MONEY: | | |
| Electric Bill Start Date: | | End Date: | | Save |

Low Battery Alerts:  O-Main  O-Clip #1  O-Clip #2  O-Clip #3  O-Clip #4

| Add Device to List | Visit PowerKuff.com | FAQs | Graphics | Quit |

METHOD AND APPARATUS FOR MONITORING POWER CONSUMPTION

PRIORITY CLAIM TO RELATED APPLICATION

This application claims the benefit of the earlier priority filing date of commonly owned and co-pending U.S. Provisional Patent Application No. 60/924,833 filed Jun. 1, 2007, which was filed in the name of the sole and common inventor, Charles G. WAGNER, which is entitled METHOD AND APPARATUS FOR MONITORING POWER CONSUMPTION, and which is hereby incorporated by reference in its entirety as though fully set forth in the present application.

BACKGROUND OF THE INVENTION

1. Field of the Invention

This invention relates to the field of devices, methods, and systems for monitoring electric power consumption of electrically powered appliances, devices, and equipment as well as power consumption of residential, commercial, and/or industrial buildings and facilities as well as organizational or business campuses of any size or configuration. The invention described herein further relates to a method and apparatus for the monitoring of electricity consumption, and more particularly, to a system including one or more current and/or power sensing devices connected to a remote monitor that enables home, business, and/or any electricity users to monitor their power consumption to enable such adjustments as are necessary or desirable to reduce and/or proactively manage and optimize electricity usage and to reduce or control associated costs.

2. Description of Related Art

The inventor herein has previously invented, with others, a power and current-sensing device disclosed and claimed in U.S. Pat. No. 4,754,218 (hereafter "the '218 Patent") and a monitoring device disclosed and claimed in U.S. Pat. No. 4,717,872 (hereafter "the '872 Patent"), both of which are incorporated herein by reference in their entirety as though fully set forth herein. The '218 Patent discloses a magnetically permeable core suitable to be disposed around a power feeder cable, such as is typically used to supply power to a residence or business from the main power grid.

A coil situated upon the core generates an induced voltage proportional to the feeder cable current without ohmic contact being required. In addition, the wrapping of a core around the current-carrying cable balances the unbalanced magnetic fields surrounding the cable, which unexpectedly reduces power loss. The '872 Patent discloses and claims a device to monitor the power being supplied to a building, such as a residence or business, using a magnetically permeable core, including a read-out unit calibrated to convert the current sensed from the core into units of power being consumed by the building.

The core and monitoring device disclosed and claimed in the '218 and '872 Patents enable a user to sense current and thus monitor the power being consumed in a building on a real-time basis. Studies have shown that when power consumption is monitored on a real-time basis, consumers reduce their consumption by an average of ten to twenty percent.

For example, a consumer may realize that a light or other appliance has been left on, or a freezer door left open, unintentionally. Alternatively, the consumer may realize that certain appliances he or she is using are not energy-efficient and may be spurred to replace those appliances with more efficient models. As energy prices skyrocket and concerns grow about power generation and consumption contributing to global warming (especially where the grid power is derived from fossil fuels), becoming more energy efficient and thus reducing power consumption is both an economic and a climatic imperative.

While the core and device disclosed and claimed in the prior art '218 and '872 Patents assist in accomplishing the goal of decreasing power consumption, they do suffer some deficiencies. For example, using the prior art devices, one can monitor only the total power being consumed in the building. At most times, more than one electrically powered appliance is being used in the building; therefore, it can be difficult to pinpoint exactly which appliance is the most inefficient.

Also, while the prior art devices include a monitor with units calibrated to show the amount of power being consumed, the monitor displays only the present power consumption and cannot provide any information as to past usage, averages per different times of day, or other information that might be useful in profiling and reducing power consumption. Further, the prior art core transmitted the data to the monitor via a wire, necessitating either locating the monitor outside the building, or running a wire into the building.

What has long been needed in the field of art is a core and monitoring system that allows for a core wrapped around a current-carrying cable to balance unbalanced magnetic fields to reduce power consumption. Preferably, such a system could be adapted in varied configurations to monitor the current-carrying cable non-invasively to enhance safety during installation and operation.

More preferably, such monitoring systems would be optionally compatible for use with a plurality of core sensors so that the consumption of individual appliances may be monitored periodically and/or in real-time. In even more optionally preferred variations, monitoring systems could be modified to communicate with and/or receive information transmitted from the cores to the monitoring hardware via a wireless method.

In additionally preferred alternative variations, the monitoring system may be augmented to sense power consumption and to communicate such information in a display or read-out scaled to and/or configured to display dimensional units that accommodate any type of electric load. In further modified embodiments, the monitoring system may also be adapted to sense power consumption periodically and/or continuously and to transmit such consumption information instantaneously, on demand, occasionally, or periodically.

Even more preferably, certain alternative power consumption monitoring systems may incorporate software and/or circuitry configured to operate, collect, display, and analyze information about power consumption either on-site, proximate to, and/or remote from the location of the electric loads. In other preferred or optional variations, the monitoring system may be implemented whereby the software can interface with the system and can correlate the monitored information with a user's electric utility bill. In this way, new, innovative, and heretofore unavailable capabilities can be established whereby power consumers and producers, distributors, traders, resellers, suppliers, and/or utility service providers or organizations or municipalities may more accurately ascertain power consumption or usage, availability, quality, and/or reliability so as to better control, manage, increase availability and quality, and/or reduce or optimize power consumption to minimize inefficiencies.

SUMMARY OF THE INVENTION

Many heretofore unmet needs are met and problems of the prior art are solved with the innovative power consumption monitoring devices, methods, firmware, software, and systems of the invention, many embodiments of which enable and establish previously unavailable features. Such features and capabilities may preferably or optionally include, among other elements and for purposes of illustration and example but not for purposes of limitation, improved and more accurate power consumption monitoring, new ways to adjust electric loads in view of more timely awareness of consumption and/or anomalies, and new power consumption sensor arrangements and monitoring capabilities. Such novel and innovative features and capabilities may also further preferably or optionally incorporate more readily configurable, reconfigurable, and easily adaptable sensors and monitors and combinations and arrangements thereof, all of which enable consumers and/or producers, distributors, traders, resellers, or suppliers to protect against and to quickly remedy low quality power or unavailability, and/or inefficient, unnecessary, and less than optimal consumption of power.

In one preferred configuration of the invention, a power consumption monitor and/or monitoring system includes at least one, and more preferably a plurality of magnetic cores adapted to be respectively situated around one or more wires, cables, conductors, and/or cords that are transmitting electric power to residential, commercial, and/or industrial equipment, appliances, buildings, facilities, and campuses. Preferably, one or all of the plurality of magnetic cores incorporates or is in communication with one or more signal transceivers or transmission circuits, which accompany or are incorporated with one or more of the plurality of magnetic cores.

Even more preferably, each of the one or more transmission circuits is configured to transmit current and power information wirelessly to at least one monitoring device and/or to receive information therefrom. In one optionally preferred configuration of any of the embodiments of the invention, the monitoring device may be adapted to wirelessly receive transmissions from any of the contemplated transmission circuits and/or to communicate information thereto. In another alternative configuration, the monitoring device may be further configured to display the current and power information and/or to retransmit such information to another device. In yet more optionally preferred configurations, the monitoring device or another component in communication therewith collects, modifies, retransmits, and/or analyzes the power and current information and displays and/or communicates modified or converted power consumption information.

For purposes of example but not for purposes of limitation, such modified and/or converted information may be ascertained through any of a number of ways that include passive, reactive, inductive, ohmic, impedance, resistive, and/or combination-type sensors. Such modified and/or converted information may describe or be further converted to describe power use, quality, availability, voltage, current, frequency, power factor, and any desired or related information. In turn, this modified and/or converted information may also be useful to compute, describe, estimate, and/or predict total, instantaneous, and/or average power consumption for a period of time, total or average power consumed per unit time, maximum and minimum power consumed at any moment in time, and/or total or average power consumed.

Preferably, any or all of such modified and/or converted information may also be attributable to and/or identifiable with respect to a specific one and/or any or all of the monitored residential, commercial, and/or industrial equipment, appliances, devices, buildings, or facilities. Such modified information may also preferably include optional information such as information that may be mathematically, statistically, or algorithmically derived from power consumption information, and which may include voltage, current, frequency, cost of power use, projected or estimated power use and cost, as well as reliability, availability, and quality of any aspect of the consumed power, and any combination thereof.

The invention further comprises, in various of its aspects and embodiments, a software program or programs and elements thereof, which may be resident on each, every, and/or any component of the power consumption monitoring system, including for purposes of example without limitation, a power consumption sensor, a sensor monitoring device, the consumption monitoring system, a computer, a computing device, and/or components and elements thereof. The components containing such resident software program and/or programs may be proximate to, remote to, and/or inside or integrated with the residential, commercial, and/or industrial equipment, appliances, devices, buildings, facilities, and/or campuses. In additionally preferable or optional configurations to any of the embodiments of the invention, such components may also be integrated with circuit breakers, subcircuit or branch conductors, as well as in appliances, devices, equipment, and any other type of electric load.

In other optionally preferred novel embodiments, any of the monitoring devices, sensors, computers, or computing devices, may be connected with any of the other components wirelessly or with a wire. Any of the contemplated components may also be in communication with any of the other components across a network, through a phone line, a power line, conductor, or cable, and/or over the internet. In other alternatively preferred configurations of the invention, the resident software program may have numerous features that, for purposes of example without limitation, enable a user or consumer to compare current power use to historical use and to evaluate or compare current costs to previous or historical costs, to compare current or prior costs to such costs for similar facilities, and/or to evaluate, compare, and/or audit such current or prior costs with respect to producer, supplier, distributor, trader, and/or utility company invoices.

More preferably, such resident software program and/or programs may enable any of the contemplated information to be communicated by text, voice, fax, and/or e-mail messages to a user or consumer either periodically, when certain predefined or predetermined conditions occur such as predefined alarm events or conditions, and/or when anomalous, unexpected, or expected power readings occur and/or are detected. One such example that may preferably create an instance when the contemplated information may be communicated by the resident software may include unexpected power use at a time when a commercial facility is closed or when personnel should not should be in the building, or when power outages or brownouts occur, or when unusually high or low consumption occurs.

Also, such resident software program and/or programs may be optionally or preferably further modified to enable special capabilities that can assist disabled, ill, or special needs individuals that reside in their own home or in any other facility and who need to manage and/or monitor their power consumption, availability, quality, and/or anomalies related thereto. More specifically and for purposes of example without limitation, the resident software and related components contemplated by the present invention may be engineered to special needs computing device that enable voice response, eye-movement response, and/or large print display or loud audio annunciator and spoken text capabilities. Additionally preferable options may include engineered adaptations of any of the variations of the inventive monitoring system that communicate any of the contemplated information, including for illustration purposes without limitation, power consumption monitoring information, in response to remote polling, on demand, occasionally, and/or periodically to such individuals and/or to their care providers, power service providers, medical providers, and/or others. Such communications can be by any of the means, modes, and methods described elsewhere herein and can preferably or optionally be used to communicate alerts regarding routine power consumption, unexpected anomalies, expected occurrences, or predetermined information related to monitoring system and component and sensor performance, power supply conditions, power consumption, and/or power quality, reliability, and/or availability.

With this optionally preferred capability, users as well as utility service providers, power service providers, medical providers, and/or others can be notified and/or alerted to existing or prospective issues regarding use, maintenance, and/or other power service issues or needs. Such notification and alerting capabilities may enable routine preventative maintenance, may prevent equipment failures and may enable faster remedy of existing or exigent issues.

In certain possibly extraordinary but optionally preferred and/or necessary circumstances, the disabled, ill, and/or special needs individuals may have a need to ensure continuous and/or maximized availability of high-quality electricity so that special needs equipment and/or appliances is/are always available for exigent, periodic, occasional, and/or continuous use. For further purposes of example, but not for purposes of limitation, such special needs equipment can include medication dispensers, intravenous and food supply pumps, defibrillators, cardiac and/or respiratory assistance machines, oxygen supply machines, hepatic and gastric and renal filtering and assistance machines, medical condition monitoring devices, emergency medical services communications devices including radio and telecommunications devices, and all sorts of similarly important, special needs equipment, devices, components, and appliances.

Even more preferably, the resident software program or programs or any element thereof may be configured to generate power consumption and usage histories and/or predicted use estimates for periods of time to create historical and/or predictive load profiles, which a user, consumer, producer, supplier, distributor, utility service provider, trader, reseller, or other person or entity may use to establish best power supply and/or consumption practices and to ascertain whether various equipment, devices, electricity metering devices, appliances, buildings, or facilities, are using power inefficiently or are otherwise experiencing anomalous power consumption or calibration issues. Such historical or predictive power consumption information may also be preferably useful in further optional configurations of the resident software that enable auditing power costs and utility service invoices and billings to ensure actual use and costs meet contractual rates and/or anticipated costs and consumption. This type of information collection and analysis capability may also preferably enable the capability to detect electric service meter malfunctions and/or calibration errors that may otherwise go undetected.

In variations of any of the optional and preferred embodiments of the invention, a power consumption monitoring system is also contemplated for monitoring the power transmitted by one or more electrical conductors. The system preferably includes one or more current-to-voltage transformers or CVTs that have a passive, open-circuit electromagnetic force (EMF) sensor or concentrator. The EMF concentrator or sensor is positioned near, adjacent, or next to one of the current-carrying electrical conductors. The open-circuit EMF concentrator can preferably include a ferromagnetic core that is wound with a wire coil, which responds to or captures the electromagnetic field or signal produced by the electrical conductors. The CVT is adapted to generate a voltage potential or an amplitude or scalar signal that is proportional to the power being transmitted through the conductor(s).

The power consumption monitoring system also may preferably include one or more first programmable radios on a chip or PROCs that are electrically connected to and which communicate with the CVT(s). The first PROC(s) are configured to transmit the amplitude signal and/or other information to other devices in the monitoring system and/or to receive information therefrom. The first PROCs include software or programming instructions or firmware that reside(s) in a storage or nonvolatile memory on the first PROC(s). The resident software of the first PROC, among other capabilities, is operative to periodically sample, store, and convert the amplitude signal to a digital quantity that represents the amplitude of the power being transmitted through the conductor(s). Also, the PROC(s) are responsive to and communicate with other devices in the monitoring system to transmit the digital quantity for further analysis or use or retransmission, and/or to receive information from other devices for configuration purposes and/or for collection, A monitoring device is also preferably included as a component of the power consumption monitoring system and includes, among elements, a second PROC, one or more second programmable systems on a chip or second PSOC(s), a multi-digit, numeric, alphanumeric, graphical, rectilinear, and/or multidimensional information display, and in some preferably optional arrangements, input, selection, manipulation, and/or configuration switches operative to control some capabilities of the monitoring device. The second PROC and the PSOC(s) may also include monitoring software that is programmed into the second PROC and/or the second PSOC(s), and which is operative to periodically communicate with the first PROC(s) to receive and store the scalar or amplitude signal or digital quantity and to display the digital quantity on the display in a unit of power consumption, and to respond to the input switch(es), and/or to receive information from other devices. In additionally preferred and optional embodiments of the novel power monitoring system, the monitoring device can also have the monitoring software adapted to collect a plurality of the digital quantities and to convert the collected plurality of digital quantities into an historical power consumption quantity, which can be shown on the display, and that can be communicated to other devices.

In yet other alternatively preferred configurations, the inventive power consumption monitor may further incorporate a radio frequency booster module, which can also include a third PROC and a third PSOC and which may communicate with any of the first and second PROC(s) to receive and retransmit the amplitude signal and/or the digital quantity an additional distance to the monitoring unit. Also, optionally preferred booster software that may reside on the third PROC and/or the third PSOC, and which operates to calibrate, quantify, and/or store the received amplitude signal and/or digital quantity, and to periodically retransmit the digital quantity the additional distance to the monitoring unit, and/or to receive and/or retransmit any other information from other devices within and without the contemplated monitoring system. Any of the first, second, and/or third PROCs may also further preferably include optional signal strength and quality information gathering capabilities that may be collected, stored, analyzed and retransmitted to any other device within or outside the power consumption monitoring system, which information can be further used to assess and/or improve the accuracy of any of the contemplated information of the monitoring system.

Particularly preferred embodiments of the innovative power monitoring system may include a computing device or a computer that may typically include a storage device, a memory, a display, one or more input devices such as a keyboard and/or a mouse pointing device, and any number of wired and/or wireless communications ports. Preferably, the computer or computing device incorporates or contains one or more software programs or elements thereof, which are resident on the computer or computing device.

Such software programs or elements are optionally and changeably configured to occasionally, upon demand, periodically, and/or continuously record the amplitude signal and/or digital quantity to an historical database of power consumption information on the storage device. The software program or programs or elements or routines thereof may acquire, be populated with, and/or access power cost information from a utility supplier, and may also compute an actual, total, average, estimated, or predicted cost of power that has been or is expected to be consumed per unit time by an entire facility and/or an individual appliance and/or group of equipment or appliances or devices, using the information stored in the historical database. Further variations enable comparison of such actual and predicted consumption information to comparable facilities, equipment, and appliances so that consumers, producers, suppliers, distributors, utility service organizations or entities, and any interested party may better assess and manage the efficiency of power use and associated costs.

In further optionally contemplated alternatives, the software programs or elements thereof may also contain or be populated with one or more predetermined and/or predefined alarm conditions or event notification parameters, and may be enabled to compare such alarm conditions or event parameters with the amplitude signal, digital quantity, and/or any other contemplated information to determine if the alarm condition is met. If so, then an alarm event or event parameter notification can be triggered and communicated to other devices in the power monitoring system, or to users or consumers by electronic message, a voice response alert system, a displayed or audio-visually annunciated alarm, a text message, an audio or visual alarm annunciator or klaxon, fax or other means of communication described elsewhere herein. Additionally preferred variations of the invention may also communicate with automated emergency power generator systems and equipment to enable instantaneous and/or rapid backup power supply augmentation or replacement as needed to accommodate power grid service interruptions, brown-outs, or unavailability.

As also described elsewhere herein, such communications may preferably have special importance in the special situations relevant to individuals or organizations that provide services to such individuals who may be experiencing short or long-term disabilities, acute or chronic illnesses, or that have other extraordinary or special needs requirements related to their electricity and power use and consumption.

These variations, modifications, and alterations of the various preferred and optional embodiments may be used either alone or in combination with one another and with the features and elements already known in the prior art and also herein contemplated and described, which can be better understood by those with relevant skills in the art by reference to the following detailed description of the preferred embodiments and the accompanying figures and drawings.

BRIEF DESCRIPTION OF THE DRAWING(S)

Without limiting the scope of the present invention as claimed below and referring now to the drawings and figures, wherein like reference numerals across the drawings, figures, and views refer to identical, corresponding, or equivalent elements, methods, components, features, and systems:

FIG. 1 shows a main sensor unit in accordance with the present invention.

FIG. 2 shows the main sensor unit of FIG. 1 removed from its housing.

FIG. 3 is a schematic of a signal generator or transceiver or transmission circuit in accordance with the present invention.

FIG. 10 is an example of information that may be displayed by the software resident on a computing device of the power consumption monitoring system in accordance with the present invention.

FIG. 11 is an example of a utility cost information input screen of the resident software of the system in accordance with the present invention.

FIG. 12 is an example of an additional utility, device, and appliance information input screen of the resident software of the system in accordance with the present invention.

FIGS. 14 and 15 are graphic representations of alarm condition parameter input screens of the resident software of the system in accordance with the present invention.

FIG. 16 shows an entry screen to select graphic display parameters of the resident software of the system in accordance with the present invention.

DETAILED DESCRIPTION OF THE INVENTION

Figure 4:
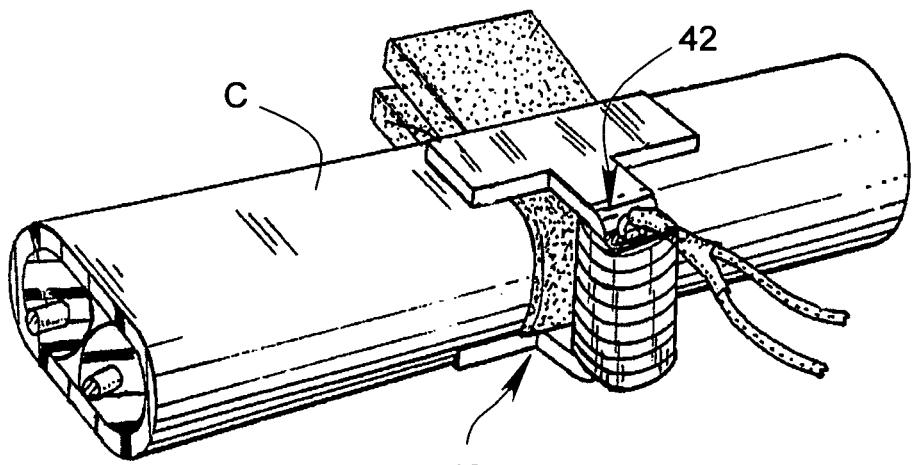
FIG. 4 shows a clip-on sensor in accordance with the present invention.

As used herein, the expression "CVT" means a current-to-voltage transformer, which is described in more detail elsewhere herein and in the above noted U.S. Pat. Nos. 4,717,872 and 4,754,218. The term "EMF" means electromagnetic force. The abbreviation "PROC" means programmable radio on a chip, which is a transceiver capable of bidirectional communications and which is described in more detail elsewhere herein. The term "PSOC" means programmable system on a chip and an example is described elsewhere herein. The term "RF" denotes the phrase "radio frequency".

Referring now to the various figures and illustrations, those skilled in the relevant arts should appreciate that each of the preferred, optional, and alternative embodiments of the inventive power consumption monitoring system 10 contemplates interchangeability with all of the various features, components, modifications, and variations illustrated throughout the written description, claims, and pictorial illustrations.

With this guiding concept in mind, and with reference now to FIG. 1, one possible embodiment of a main sensor unit 12 is illustrated, which is attached to a current-carrying, electrical power supply conductor "C" that may be located on an exterior of a building or facility and that supplies power to an electric service meter E. In other arrangements not shown here but likely apparent to those knowledgeable in the arts, the main sensor unit 12 may also be positioned proximate to or may be attached to the conductor C in interior locations such as inside a circuit breaker panel or other type of distribution enclosure or service junction, and/or branch conductor or subcircuit.

In further preferred but optional configurations contemplated by the inventive system 10, the sensor unit 12 may be integrated into circuit breakers, circuit breaker panels, sub-circuit or branch conductors. The sensor unit 12 and other devices of the novel monitoring system may also preferably be reconfigured for use in all types of peripheral monitoring applications including integration into or with discrete power-consuming equipment, electric loads of all kinds, and/or any electric power-consuming appliance or device. The main sensor unit 12 may also preferably include a non-conductive and weather-proof housing 14 that protects the components of the unit 12, and which can be attached to the conductor C with a fastening device such as, but not limited to, hook and loop type straps 16 that are also known as VELCRO® straps.

With continued reference to FIG. 1 and now also to FIGS. 2 and 3, it can be understood that the main sensor unit 12 may incorporate a signal transceiver, communication and/or transmission circuit or radio frequency (RF) signal generator 20 that includes an amplitude signal generator or core 22 similar to that disclosed and claimed in the previously noted '218 patent. The signal transceiver or transmission circuit 20 may be powered by a replaceable and/or rechargeable battery or batteries B, such as one, two, or more AA-sized batteries, or by a solar cell (not shown), or by any other suitable power source including inductive and other types of power supplies that may parasitically obtain power from the conductor that is being monitored.

The core 22 may be a Hall Effect sensor or a CVT that incorporates a passive, open-circuit EMF sensor or concentrator. Preferably, the core 22 is positioned in the housing 12 so that when the housing 12 is affixed to the conductor C, the core 22 is proximate to the conductor C. In this arrangement, the CVT or core 22 will generate an amplitude signal across the terminals 24 (FIG. 3) in the form of a voltage differential or potential, which is proportional to the power being transmitted through the current-carrying conductor C.

More preferably, and as may be comprehended with continued reference to FIGS. 1, 2, and 3, and with reference now also to FIG. 4 and the '218 and '872 Patents, the open-circuit EMF sensor or concentrator or core 22 may be formed as a ferromagnetic core that is wound with a wire coil to be responsive to the electromagnetic field or signal produced by and proximate to the electrical conductors C. The response of the open-circuit coil results in a voltage differential across terminals 24, which establishes the contemplated amplitude or scalar signal.

The described signal-generating transceiver or transmission circuit 20 may incorporate a number of discrete components and/or single chip-type combined or integrated components. In one optionally preferred arrangement, the signal transceiver or transmission circuit 20 incorporates a power supply circuit 24 that incorporates a voltage regulator 26 configured to protectively supply power to the circuit 20. Any number of equally suitable power supply circuits may also be used, and one possibly preferred type of voltage regulator can be the ON Semiconductor LM2931 series Low Dropout Voltage Regulator, model LM2931-5.0, which is described for purposes of example but not limitation.

The signal communication and/or transmission circuit of FIG. 3 may also further incorporate either a single, first PROC in the form of a discrete component, or may incorporate both the first PROC as well as a PSOC that can augment the capabilities, programmability, and reconfigurability of the main sensor unit 12. In one exemplary arrangement of the signal transceiver or transmission circuit 20, the EMF concentrator 22 is in bidirectional communication with the PSOC 34, which can be a Cypress Semiconductor Corporation PSOC Mixed Signal Array, model CY8C27143. In this possibly preferred arrangement, the PSOC 34 receives the amplitude signal at terminals 24 and communicates with the first PROC 32, which may be any number of suitable PROC transceiver components such as, for purposes of example without limitation, a Cypress Semiconductor Corporation PROC transceiver, model CYWUSB6953. This and other similarly capably PROCs may preferably be modified to generate and to capture signal strength information that may be sampled, collected, and used to establish signal reliability indicia and related information that can be further used to assess quality and reliability of the other contemplated information described elsewhere herein. (See, e.g., FIG. 17).

In any of the optionally preferred arrangements of the signal transceiver or transmission circuit 20, the first PROC 32 and/or PSOC 34 may be programmed with firmware or software instructions contained in the nonvolatile flash memory of either component 32, 34, which instructions are operative to periodically sample the amplitude signal and to convert and store the sampled amplitude signal, in a portion of the nonvolatile memory, as a digital quantity that represents the magnitude of the power being transmitted through the conductor C. Additionally, the software instructions may be further operative to periodically communicate with and to transmit the digital quantity and/or receive information from other devices, via an antenna 36 that is typically integrated with the PROC 32, to other devices or components of the power consumption monitoring system 10 as described elsewhere herein.

Any of the various optionally preferred embodiments of the inventive signal transceiver or transmission circuit 20 may further be adapted with software instructions that enable the circuit 20 to hibernate for a majority of the time to conserve power, to receive calibration, configuration, and/or other information, and/or to periodically transmit the scalar or amplitude signal and/or the digital quantity after a preset amount of time has elapsed, or to transmit only in response to occasionally and/or periodically received polling requests from other devices and/or components of the power consumption monitoring system as described elsewhere herein, or in any combination of periodic time intervals and/or polling requests.

With continued reference to the various figures and now also specifically to FIG. 4 and the '218 patent, the main sensor unit 12 may be replaced by or accompanied by a peripheral and/or clip-on sensor or clip 40, which may be sized to be smaller or to have a different three-dimensional geometry than the main sensor unit 12. The possibly preferable modified geometry may be identical or similar to sensor unit 12, and may be further modified to be more suitable for attachment to smaller power cables or cords. In other optionally preferable variations of any of the contemplated embodiments, the peripheral or clip sensor 40 may also be integrated into individual circuit breakers, subcircuit and/or branch conductors, individual equipment, as well as individual devices and appliances.

In any of such contemplated arrangements, the peripheral or clip sensor 40 may be customized to monitor the power consumption of a particular machine, a single appliance, or other device in any number of configurations that may be best suited to the particular preferences of consumers or suppliers or the relevant power-monitoring application. It may also be possibly preferred to have the peripheral sensor or clip 40 attach to such power cables or cords with a spring or spring-clamp fastener 42 or the hook and loop-type straps or fasteners 16 described elsewhere herein.

Peripheral sensor or clip 40 may preferably incorporate the same EMF sensor or core 22 or RF signal generator or signal transceiver or transmission circuit 20 or a similar circuit. In additional variations to the contemplated peripheral sensor or clip 40 and the main sensor unit 12, each or either may be further adapted to produce the amplitude signal and/or digital quantity, or to ascertain and transmit the on-and-off state or condition of equipment or any device that is to be monitored.

In this way, either or both the main sensor unit 10 or the peripheral sensor or clip 40 can transmit the on-or-off status of anything that is being monitored for power consumption. In this possibly desirable, alternative configuration, it may be further preferred to employ multiple peripheral or clip sensors 40 and/or one or more additional main or peripheral sensor units 12 attached to a primary grid supply conductor, and/or to subcircuit or branch conductors so that power consumption can be compared to determine the difference in power consumption between the on and off conditions of anything that is being monitored, which enables a determination of power use by groups of equipment and/or individual appliances.

Figure 5:
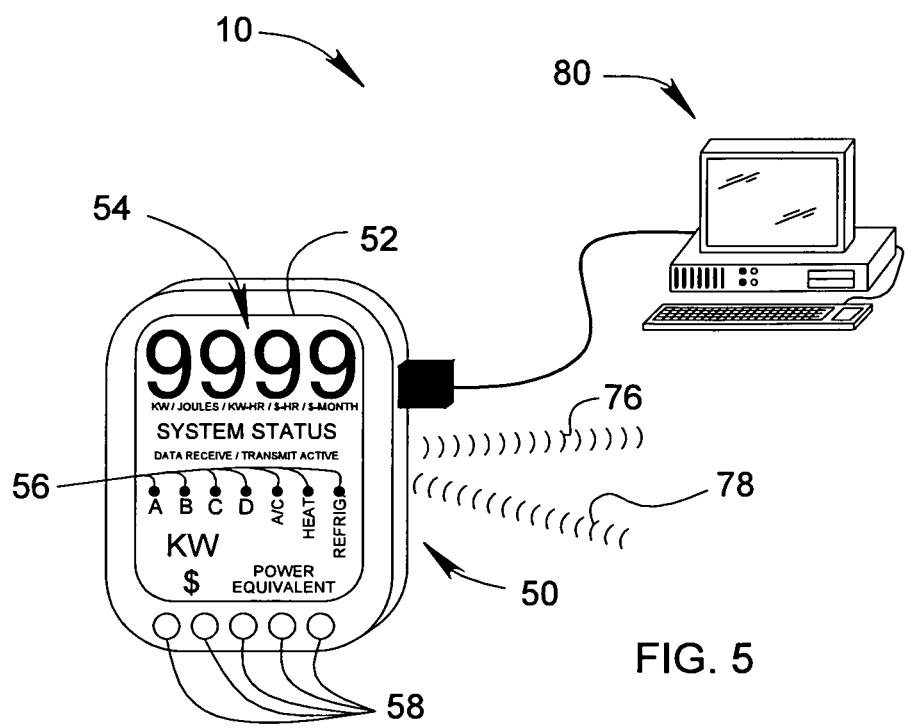
FIG. 5 shows a monitoring and display unit connected with a computing device in accordance with the present invention.
Figure 6:
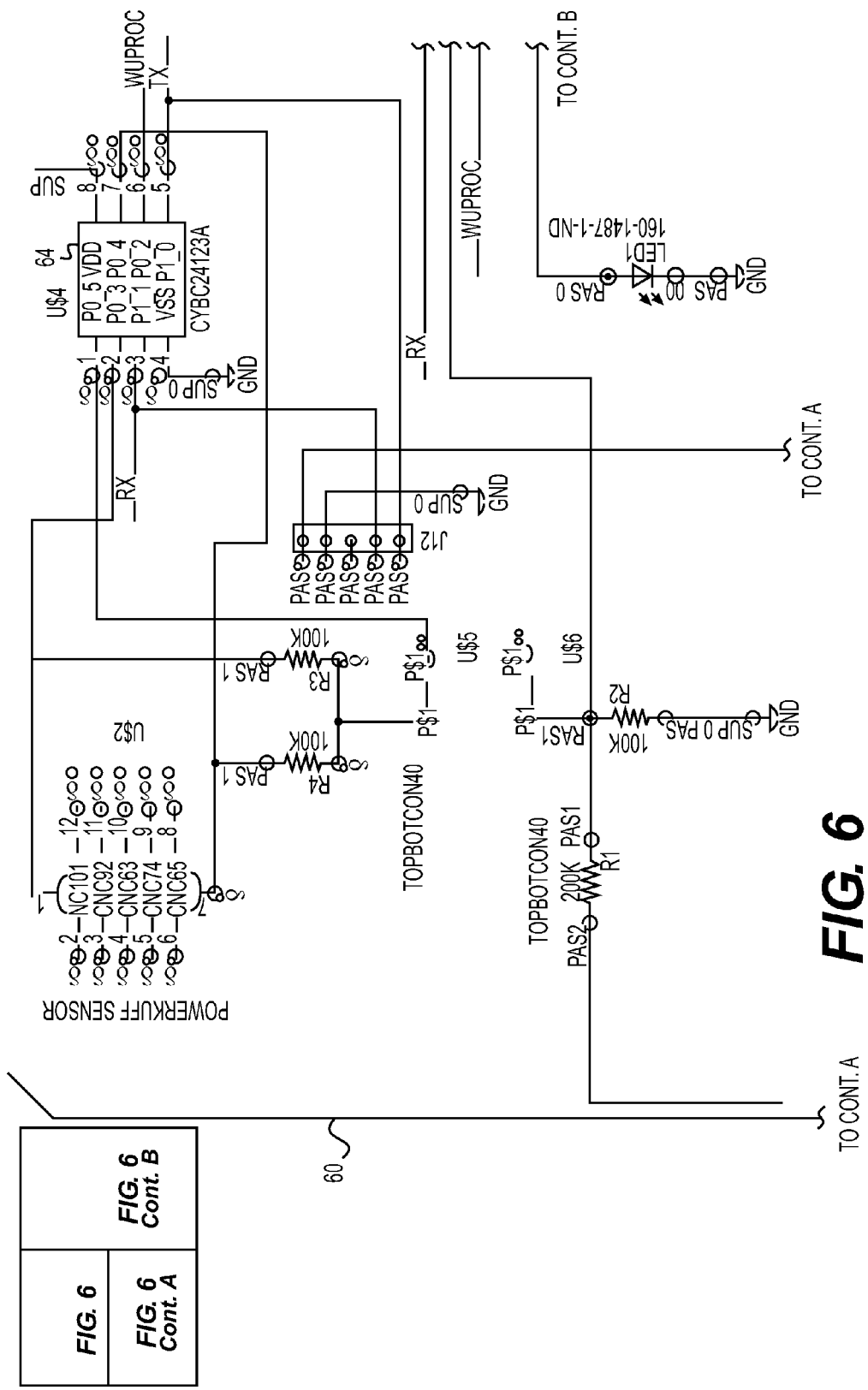
FIG. 6 is a schematic of a radio frequency signal generating or transceiver or transmission circuit of the monitoring and display unit in accordance with the present invention.
Figure 6:
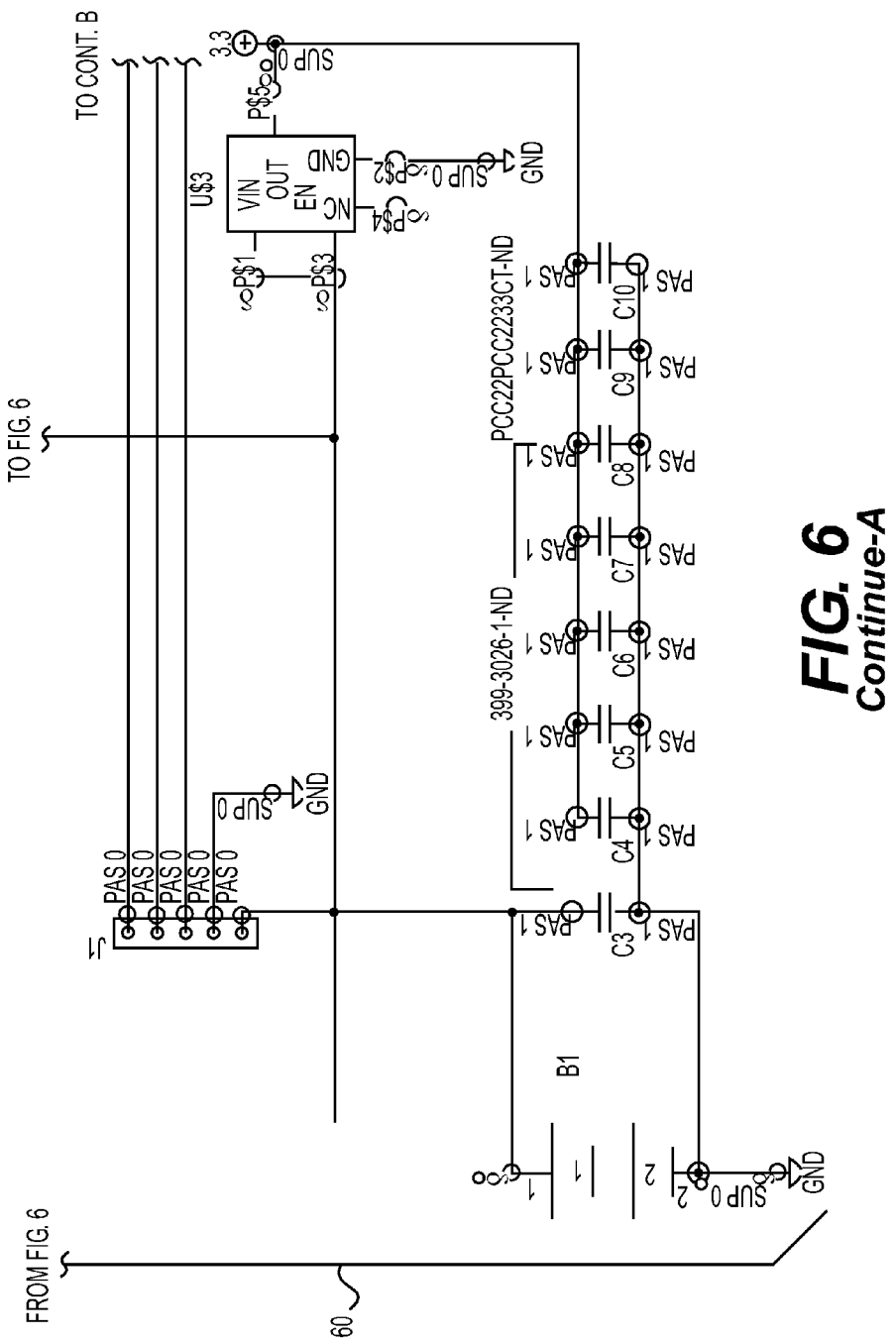
Figure 6:
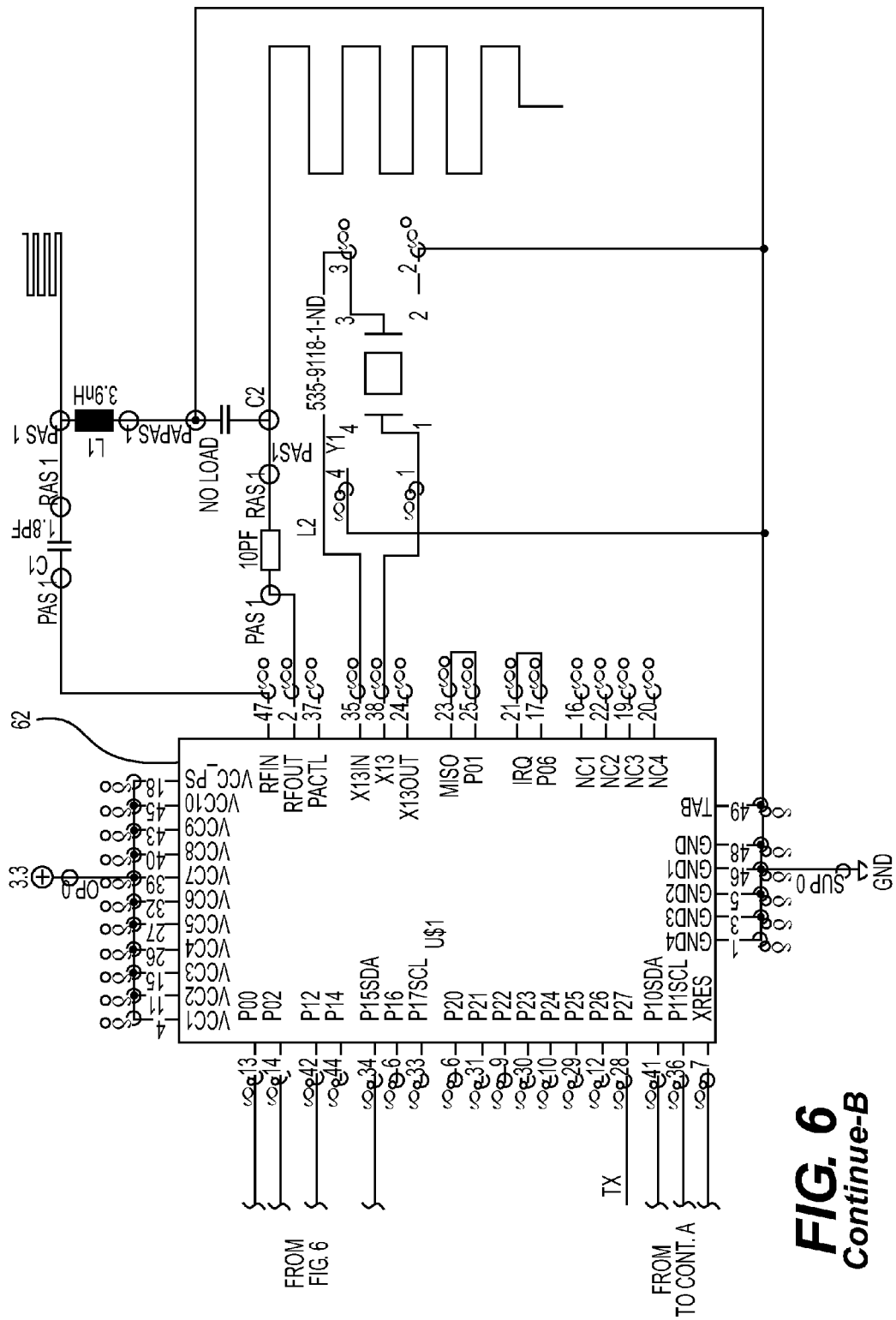

With reference now also to FIGS. 5 and 6, the new power consumption monitoring system of the invention also incorporates a RF signal monitor and display, or monitoring device or unit 50 that is integrated with one or more communications ports that may include universal serial bus ports, fire wire or 1394 ports, serial ports, IC2 ports, network ports, infrared ports, and/or any other desired communications ports readily known to those skilled in the relevant arts. The monitoring device 50 may further include one or more display panels 52 that may preferably include a multiple digit, numeric, alphanumeric, graphical, rectilinear, and/or multidimensional information display 54, which also may include one or more device on-off condition or state graphical icons or pips 56, and one or more input or configuration or selection switches 58 adapted to manipulate or modify or configure or convert the information shown on the display 54 and/or to modify the configuration and/or the operation of the monitoring device 50 and/or the resident software and/or monitoring system 10. The monitoring device also preferably incorporates a RF signal generating or transceiver or transmission circuit 60 (FIG. 6) that may further include a second PROC 62.

With respect to the contemplated switches 58, one possible type of such manipulation that can be enabled by switches 58 may be to convert the displayed dimensional units of power consumption information or to select or change what or which portion of type of information is displayed. Other capabilities of such switches may preferably include the optional modification of the periodicity of polling of the sensor devices 12, and/or any other aspect of the function and/or operation of the monitoring system 10. The exemplary illustrations and figures reflect a limited number of such switches 58. However, further contemplated and optionally preferred embodiments of the instant invention may also incorporate a greater or lesser number of such switches ranging from zero switches to an alphanumeric and function keyboard having all possible combinations of alphanumeric characters in any language, and which may be similar to any known alphanumeric and function keyboard presently known and contemplated by those having skills and knowledge in the relevant arts and as depicted in connection with the illustrations reflecting computing device 80 (See, e.g., FIG. 5).

The monitoring device 50 may further include a second PSOC 64 to be in communication with the second PROC 62 and the display 54. The contemplated second PROC 62 and PSOC 64 may be selected from any of the discrete components or combinations thereof described as being suitable for use with the signal transceiver or transmission circuit 20, or may be selected from any number of similarly capable or configured devices, sensors, or discrete components.

The monitoring device 50 also preferably includes monitoring software resident on or contained in the nonvolatile flash-type memory that is typically or optionally available for use with the second PROC 62. More preferably, the monitoring software is configured to occasionally, on demand, or periodically communicate with, send information to, and/or to poll the first PROC 32 to request transmission of the scalar or amplitude signal or digital quantity or other information, which is then received and stored by the second PROC 62 and/or PSOC 64.

The monitoring software is preferably further operative to convert the digital quantity to a unit of power consumption, such as a number referred to herein as a "Power Equivalent," which may be, for purposes of illustration but not for purposes of limitation, a four-digit number from 0000 to 9999. This power equivalent number may represent the power being consumed in arbitrary units, a unitless number, a "true" reading of actual power usage in kilowatts, as a number that represents the cost per unit time of power being consumed, a running or historical average or total of power being consumed, and/or a cumulative or periodic total of power consumed, or any other conceivable quantity that represents desired or relevant power consumption information. The contemplated Power Equivalent may be translated or converted into an actual kilowatt amplitude of total facility power consumption or individual appliance consumption, a ratio or percent of power consumed by a respectively monitored appliance, an actual total facility cost of power consumed, a cost or cost ratio or cost percentage for an individually monitored appliance or for all monitored appliances, or a cost per kilowatt number as also described elsewhere herein. See, e.g., FIGS. 5 and 9.

In even more preferable modified embodiments of the inventive power consumption monitoring system 10 (FIGS. 5, 7, 8, 9), the monitoring and display device 50 is configured as a master device wherein the second PROC 62 and the second PSOC 64 control and poll the first PROC 32 and the first PSOC 34 as slaves. Even more preferably, the master second PROC 62 and second PSOC 64 control one or more or a plurality of slave first PROCs 32 and PSOCs 34 in the main sensor unit or plurality of units 12 as well as the clip-on sensor 40 and a plurality thereof.

In one optionally preferred mode of operation, the second PROC 62 and/or

PSOC 64 of master monitoring and display device 50 transmits requests for data to the main sensor unit(s) 12 and the clip(s) 40. The master second PROC 62 and PSOC 64 also may be configured to hibernate between polling requests to conserve energy, and to occasionally or upon demand/or periodically activate or "wake up", such as once every second, to poll or request information from the slave first PROCs 32 and/or PSOCs 34. With continued reference to FIGS. 1 through 5 and now also to FIGS. 6, 7, 8, and 9, the contemplated master-slave arrangement and polling and information request operations are illustrated in more detail in schematic and functional representations.

Figure 7:
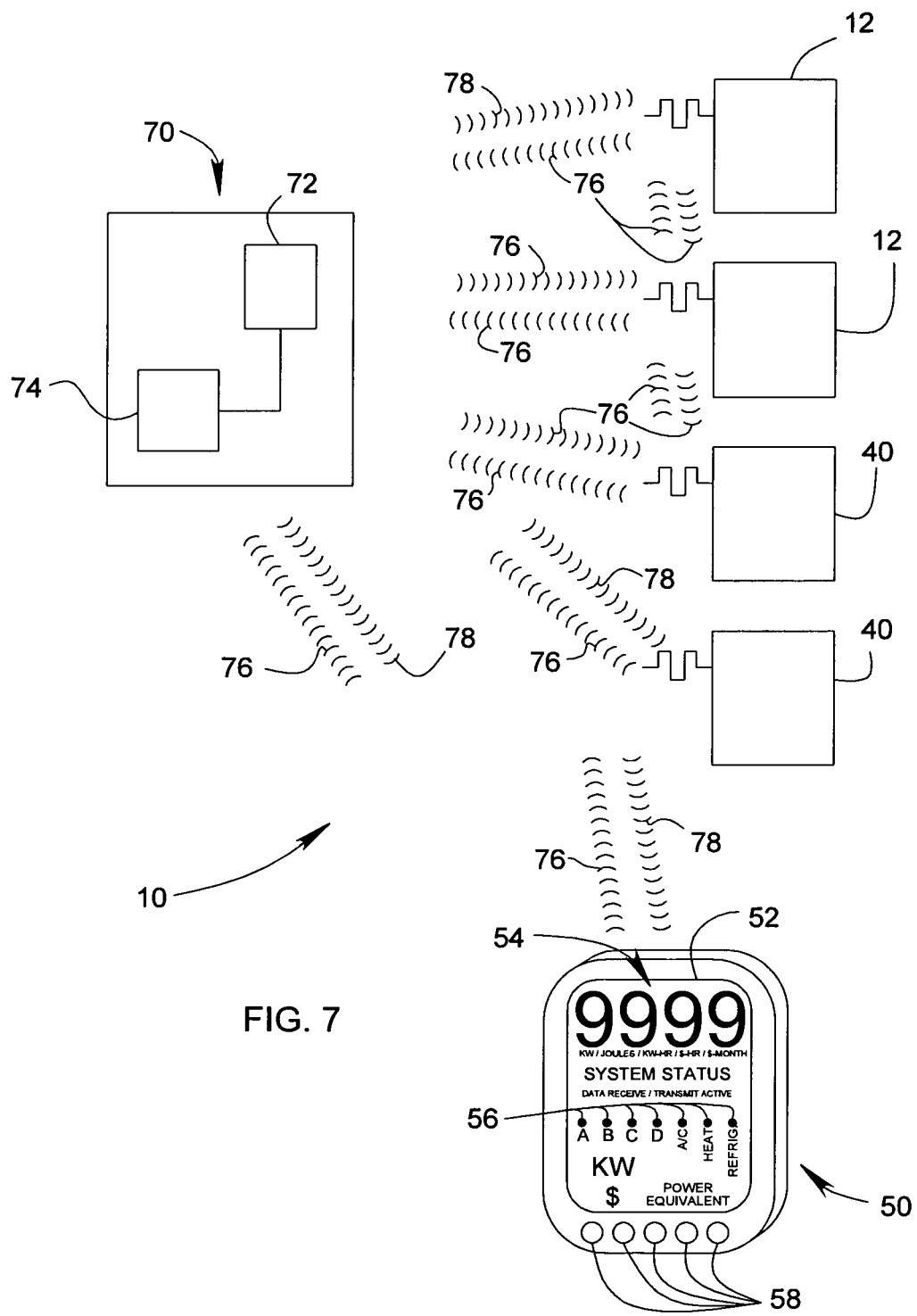
FIG. 7 is a functional schematic of an RF repeater or booster module of the power consumption monitoring system in accordance with the present invention.
Figure 9:
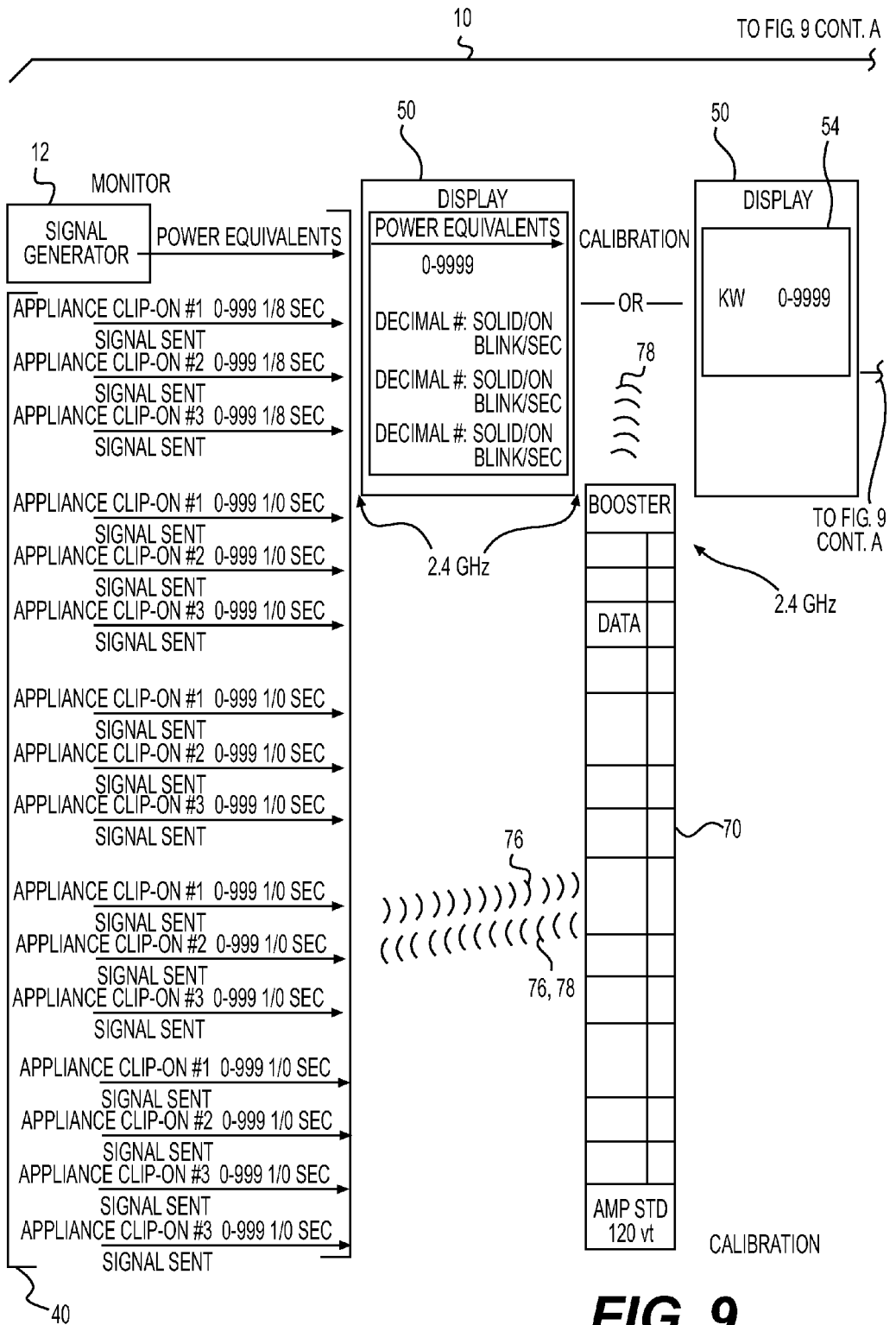
Figure 9:
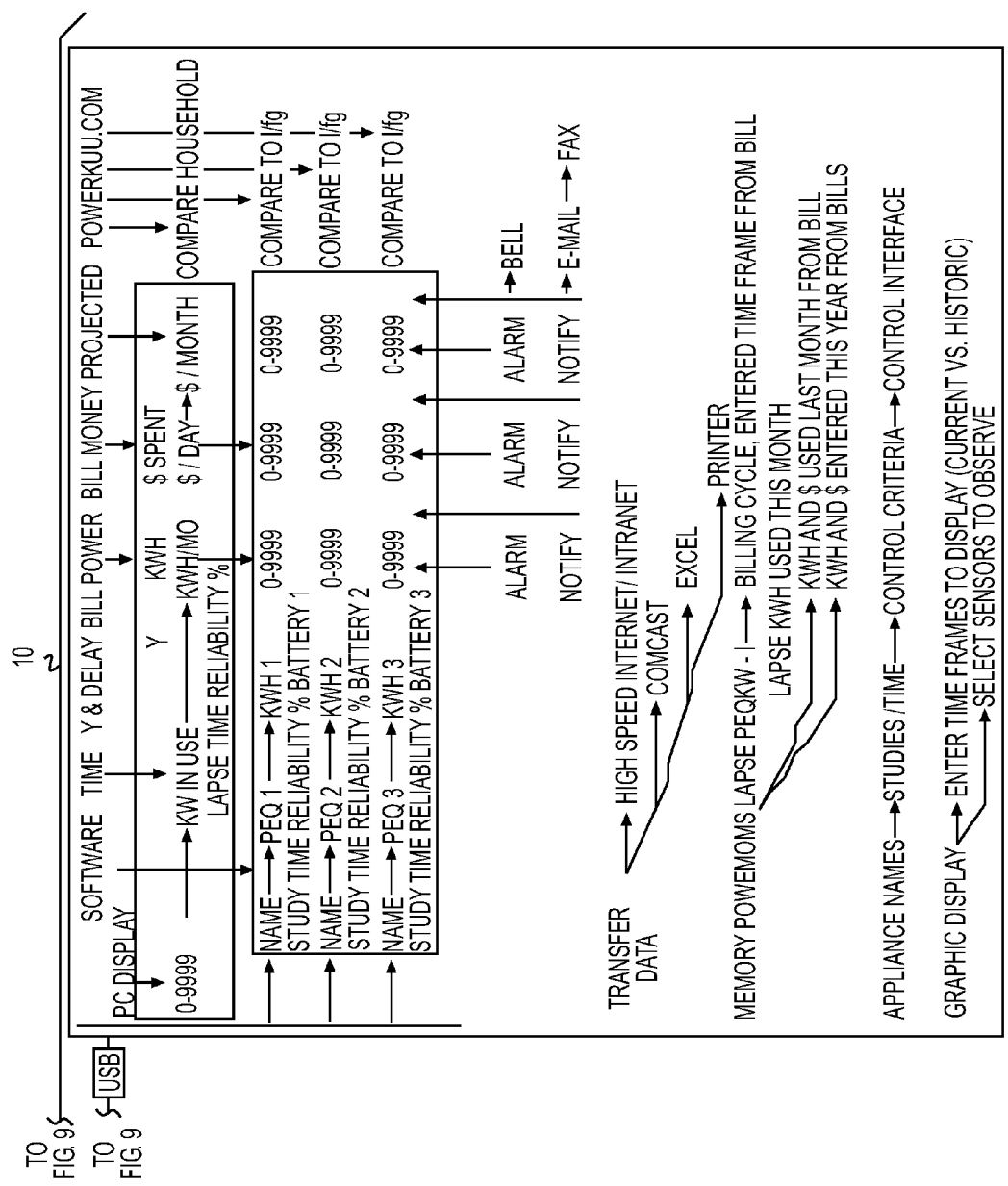

Any of the optional and preferred embodiments of the invention may be further modified to operate in combination with an RF repeater or booster module 70, which is functionally depicted in FIGS. 7 and 9 in operation with other components of the contemplated power consumption monitoring system 10 of the invention. More specifically, the contemplated RF repeater or booster module 70 may preferably incorporate a third PROC 72 and a third PSOC 74 that may be the same as or similar to the PROCs and PSOCs described in connection with the first and second PROCs 32, 62 and PSOCs 34, 64.

The third PROC 72 and PSOC 74 are adapted to communicate with the first and second PROCs 32, 62 and PSOCs 34, 64 to receive and retransmit the amplitude signal or other information 76 (FIGS. 7, 8, 9) an additional distance 78 to the monitoring unit 50. As also discussed elsewhere herein, bidirectional communications may preferably or optionally be incorporated so that the booster software or any other contemplated device or component of the invention may communicate calibration, configuration, polling requests, and other information between any other contemplated device of the monitoring system 10. Further, booster software is preferably loaded into the nonvolatile flash memory of the third PROC 72 and/or PSOC 74 and/or other element, and may be operative in one aspect to poll or request the amplitude signal and/or digital quantity information and/or other information from the first PROC 32 and PSOC 34.

More preferably, the contemplated booster software may preferably receive signals and information from the main and peripheral sensors 12, 40 and use those received signals and information to calibrate and/or normalize the information to enable more accurate reporting and computation of the contemplated power consumption and related information. In optionally preferred configurations, the booster software or portions or routines therein receives and stores the amplitude signal, digital quantity, signal strength, and/or other received information obtained from the main sensor unit or units 12 and the peripheral or clip-on sensor or sensors 40.

In further preferred variations, the booster software also may periodically retransmit the scalar or amplitude signal and/or digital quantity, and/or any other information the additional distance 78 to the monitoring unit 50. When needed or as preferred, the monitor unit 50 may be physically remote from the booster module 70 and the sensors 12, 40. In other equally preferred and optional variations, the monitor unit 50 may be situated proximate to the booster module 70 and/or the main and peripheral sensors 12, 40. The booster software calibrates the amplitude signal and/or digital quantity to a reference value in units of power consumption that for purposes of example but not limitation can be kilowatt-hours.

In additionally preferred and optionally suitable variations of any of the configurations of the monitoring system 10, the booster module 70 is more preferably arranged with an ohmic connection to the monitored power grid. In other modifications, reactive, inductive, and/or other types of connections may be more suitable. The optionally preferred ohmic connection may in certain applications enable more accurate sensing of power grid reference or baseline or nominal voltages, currents, frequencies, or other parameters. The ohmic connection may be accomplished by positioning or mounting the booster module 70 in a standard power outlet or receptacle, and may also be connected in any other way such as with an alligator-type spring clip, a soldered connection, a clamp-on connector, an inline connector, or other similar means.

The booster module also preferably includes what is often referred to by those skilled in the relevant arts as a precision resistor or similar connoted device, which may be occasionally, on demand, and/or periodically switched on to enable very accurate load, power, voltage, and/or current information to be ascertained. Such very accurate information can then be captured and compared to the signals and similar information received from the main and peripheral sensors 12, 40.

During initial installation and with continued operation, the resident software of the various components and the booster software include a portion or a routine that ascertains the nominal amplitude and/or digital quantity linear power response slope of each of the main and peripheral sensors 12, 40. The booster software uses the respective response slopes and the periodic signals and information received from each main and peripheral sensor 12, 40, as well as the very accurate load information obtained using the precision resistor to calibrate, baseline, normalize, and/or correct the signals and information received from each main and peripheral sensor 12, 40. In this way, each sensor 12, 40 is periodically recalibrated to maximize accuracy. The resident and booster software may be configured to regularly sample and accumulate signal and other information from one, some or all such sensors 12, 40 and to apply well-known statistical methods to optimize calibration and accuracy of the signals and other information.

Even more preferably, the RF signal generator and booster module 70 is configured to be used so that the third PROC 72 and PSOC 74 will automatically seize control from the monitoring device 50 of the slave first PROCs 32 and PSOCs 34. Most preferably, the booster software and the monitoring software are preconfigured to automatically detect the mutual presence of one another. Thus, when the booster module 70 is operationally positioned within the range of the signal transceiver or transmission circuit(s) 20 of the main sensor unit(s) 12, the clip-on sensor(s) 40, and the monitor and display unit 50, the monitor unit 50 automatically relinquishes its master polling status. More preferably, the monitor unit 50 will then also display the information communicated by the booster module 70, and may even more preferably retransmit such information via wired or wireless communications to other components and devices of the monitoring system 10.

The main and peripheral sensor unit(s) 12 and the peripheral clip-on sensors 40 assume what can be referred to as a primary slave status that operates in response to communications from or polling or information requests from the booster module 70. Further, the monitor and display unit 50 may also be manually relegated or may automatically relegate itself to a secondary slave status whereby it passively receives transmissions from the booster module 70 and responds by recording, processing, displaying, and communicating the received amplitude signals and/or digital quantity information. Once the monitor and display unit 50 receives and records the amplitude signals and/or digital quantity information, such can be displayed or further communicated to other components of the power consumption monitoring system as described elsewhere herein.

Any of the embodiments of the novel and inventive power consumption monitoring system may be further modified to incorporate one or more computing devices and/or computers 80 (FIGS. 5, 8, 9) that may be proximate or remote to any of the system components already described. The one or more computing devices and/or computers 80 may preferably include a storage device, a nonvolatile and/or volatile memory, a display, a keyboard and pointing device, and any of a number of communication ports already described elsewhere herein.

More preferably, the computing device or computer 80 is in communication with the monitoring device 50 via any one or more of the contemplated communications ports and contains a software program and/or elements thereof resident on one or more of the storage device and/or the volatile and/or nonvolatile memory. The storage device and/or the volatile and/or nonvolatile memory may be selected from what are known to those skilled in the art as hard disk drives, flash memory drives, volatile random access memories (RAMs), and any other type of nonvolatile RAMs and similarly capable devices.

Figure 8:
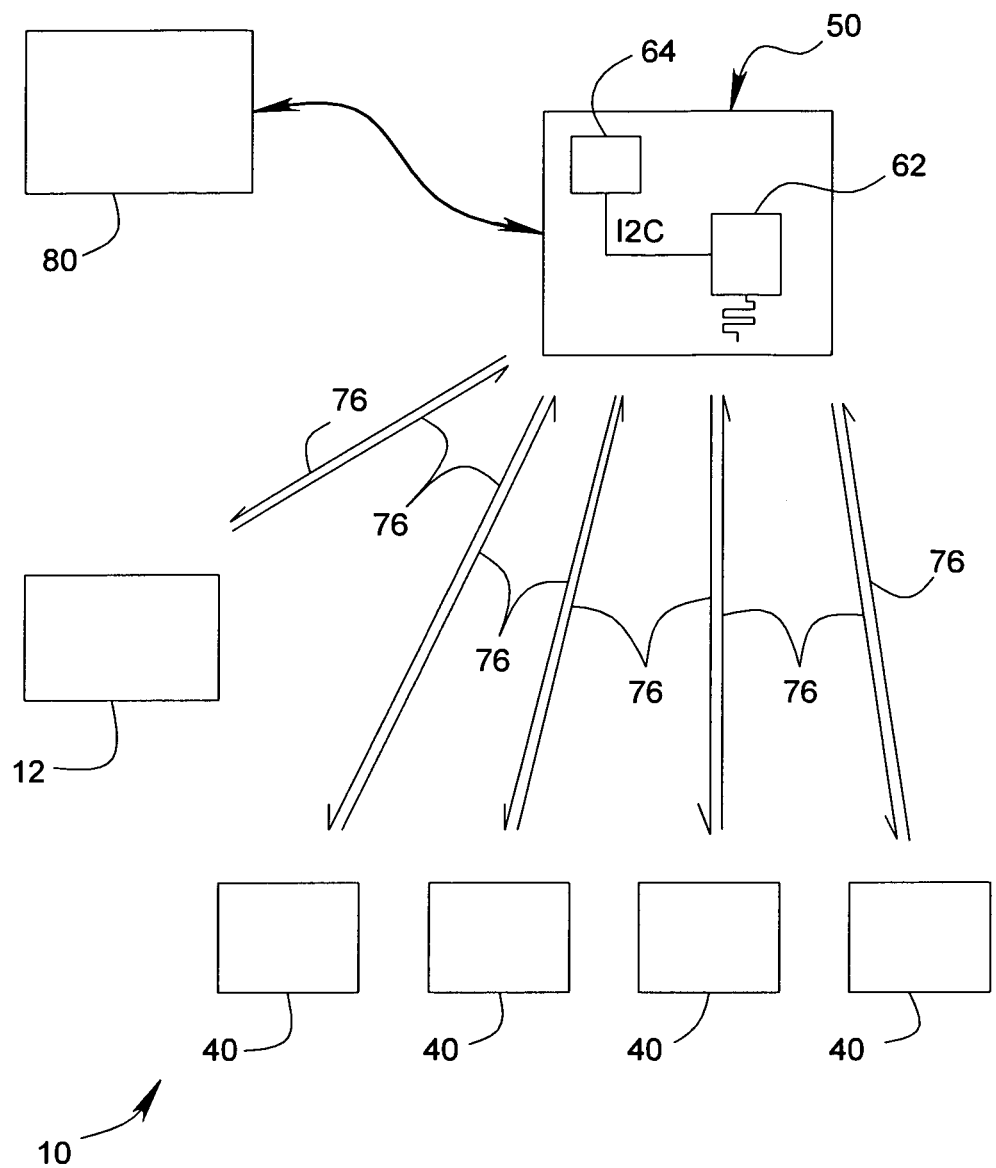
FIGS. 8 and 9 are functional schematics and flow diagrams illustrating the polling operation and flow of communications and information of the power consumption monitoring system in accordance with the present invention.

Even more preferably, and with reference now also to FIGS. 8, 9, and 10, the resident software program and/or elements thereof includes one or more routines to receive the amplitude signal and/or digital quantity information or other information from the monitoring device 50 and to periodically record this information to an historical database of power consumption information on one or more of the storage device or memories, and to display such information in various forms. As also described elsewhere herein, the resident software program or programs may be configured to enable auditing of utility service bills and invoices and may further be used to compare actual power use adduced by the monitoring system 10 to the use recorded by the electric meter E (FIG. 1), which can enable detection of malfunctioning or improperly calibrated electronic or mechanical utility service meters.

Figure 13:
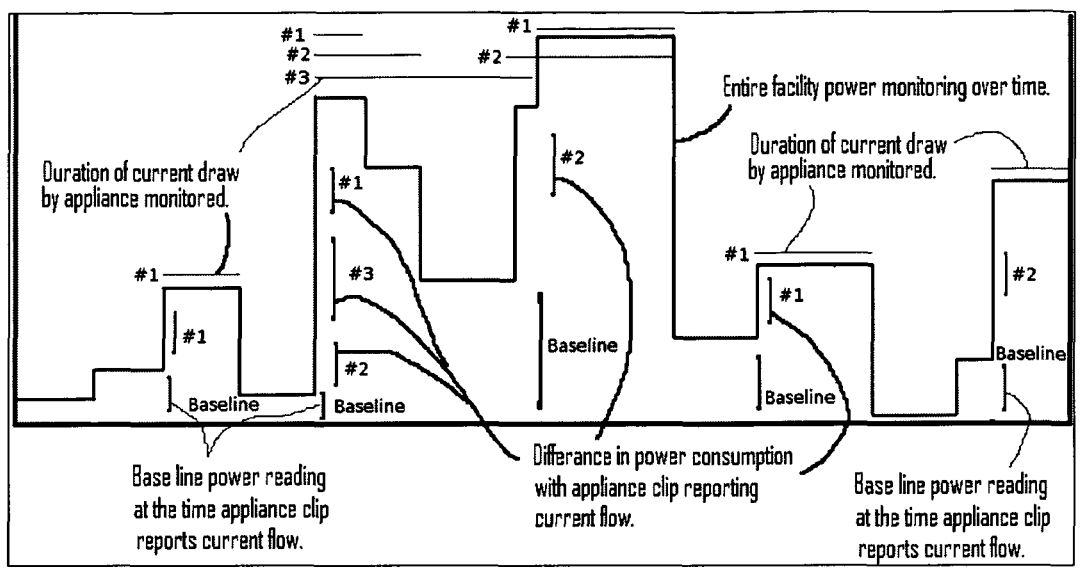
FIG. 13 shows a graphic representation of power consumption displayed by the resident software of the system in accordance with the present invention.

Most preferably, the software program and elements thereof may optionally or preferably include routines to input, store, and/or access local or remote power cost information such as utility supplier cost rates (FIGS. 11, 12), and to compute actual and projected costs for power consumption as a function of the amplitude signal and/or digital quantity information and the historical database power consumption information. Further, such computed and projected costs may be displayed as shown in FIGS. 5, 9, and 10. As may also be seen in FIGS. 10, 13 and 16, such current, historical, and projected power consumption information may be numerically and/or graphically displayed on the display of the computer 80 by additional routines of the resident software program.

Additionally preferred variations of any of the embodiments of the invention may also contemplate the resident software program and elements thereof to include one or more routines that (a) input, store, and access one or more predefined alarm conditions, (b) compare the amplitude signal and/or digital quantity information to each such condition, and (c) communicate an alarm event when such conditions are met by the amplitude signal and/or the digital quantity information.

Figures 14, 15:
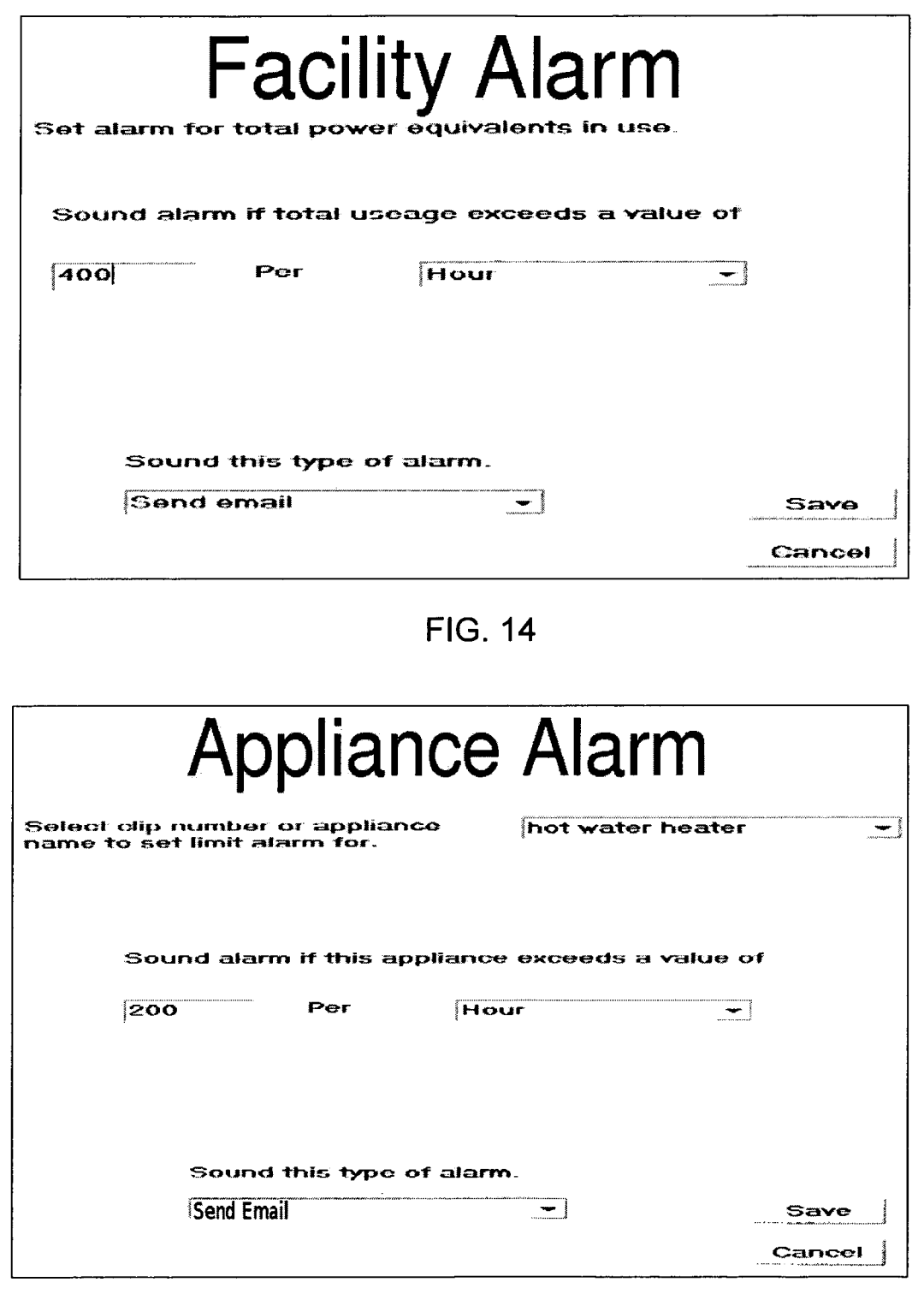

The power consumption monitoring system contemplates many possible alarm conditions, FIG. 14, that can be predefined as desired and that may include, for purposes of non-limiting examples, a facility or campus-wide total power consumption alarm condition that may be triggered if the total power being consumed exceeds a predetermined amount. An example of this total power condition may be modified so that any power consumption above zero triggers the alarm event if power is consumed during time periods when no power consumption is expected, such as in a commercial facility that is usually inoperative during nights, weekends, or holidays. (See, e.g., FIGS. 9 and 14).

In this way, the facility can be protected against unauthorized, off-hours use. Further, such a facility can be protected against unexpectedly wasteful or inefficient power consumption due to malfunctioning equipment or devices by setting the total power consumption alarm condition to a predetermined maximum amount. A residential property may be similarly protected by setting a total power consumption alarm condition that corresponds to a maximum power consumption expectation. Any type of residential or other facility may also be monitored with similarly configured alarms that can trigger an audit of utility service bills, and may be profiled to establish baseline or nominal power consumption profiles or expectations.

The resident software program and elements thereof may also include routines configured to monitor single devices and/or appliances as can be understood with reference to FIGS. 9 and 15. Individual appliances may be associated with one or more main sensor units 12 and/or clip-on sensors 40 so that power on and off conditions maybe be identified, and so that actual power consumption may be ascertained and stored. Also, predefined alarm conditions may be established so that an inefficient and/or malfunctioning appliance or other device may be readily identified, which can avoid wasted power consumption. As discussed in more detail herein, such predetermined or predefined alarms may preferably be set to trigger notifications to service providers seeking to obtain early warnings of possible issues related to individuals with special needs that are associated with a disability, illness, or other extraordinary set of circumstances.

Figure 16:
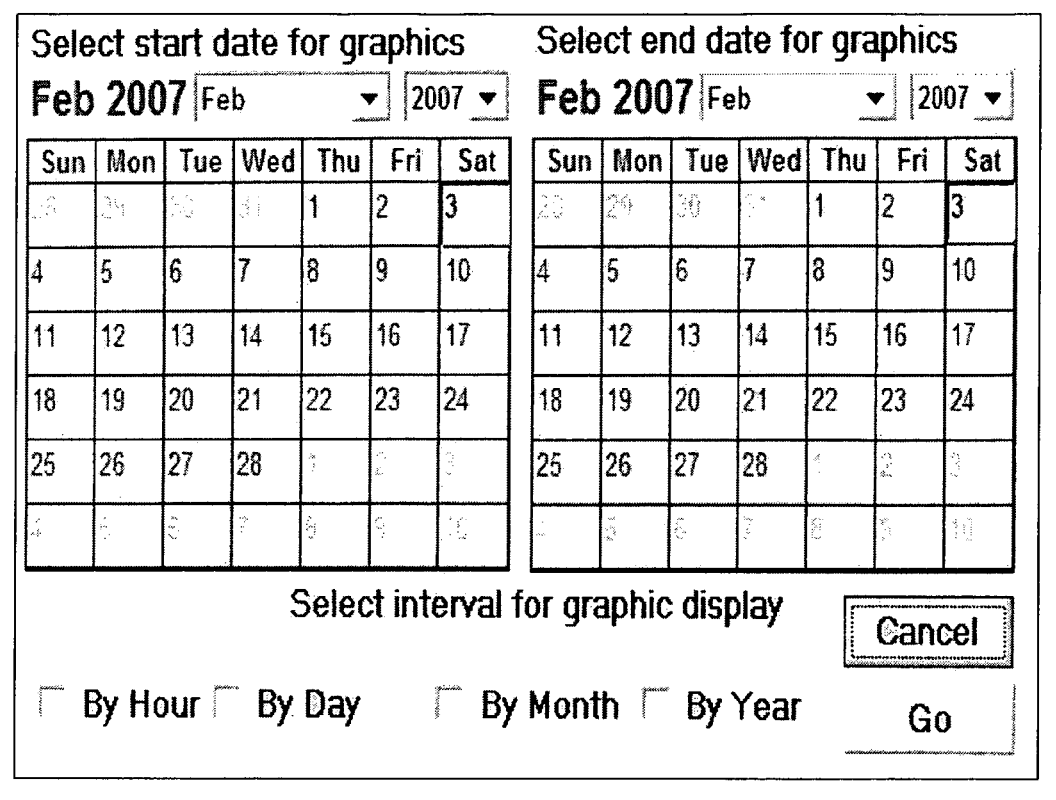
Figure 17:
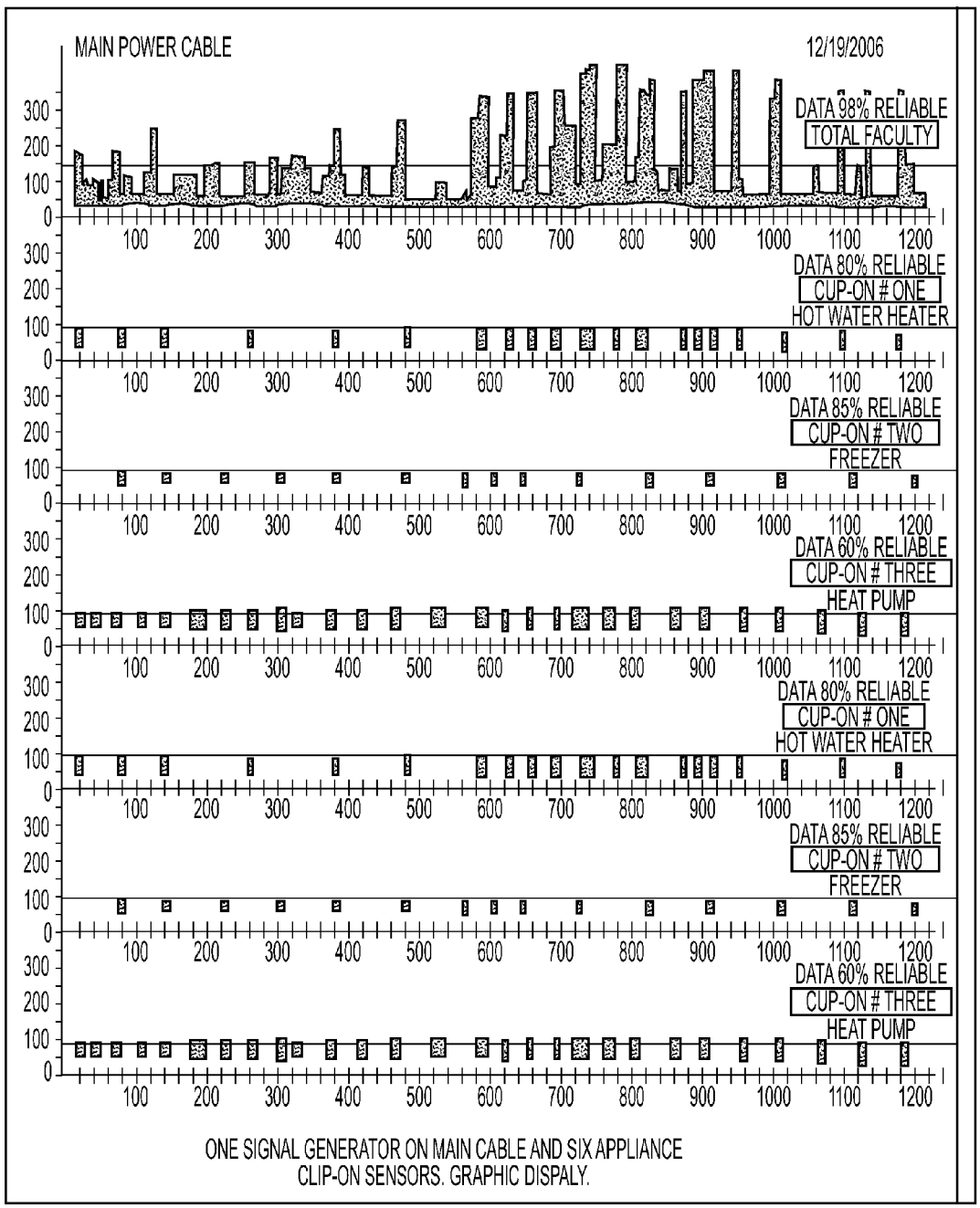
FIG. 17 shows a graphical comparison of total power consumption of a facility along with power consumption of individual appliances for a period of time as displayed by the resident software of the system in accordance with the present invention.
Figure 18:
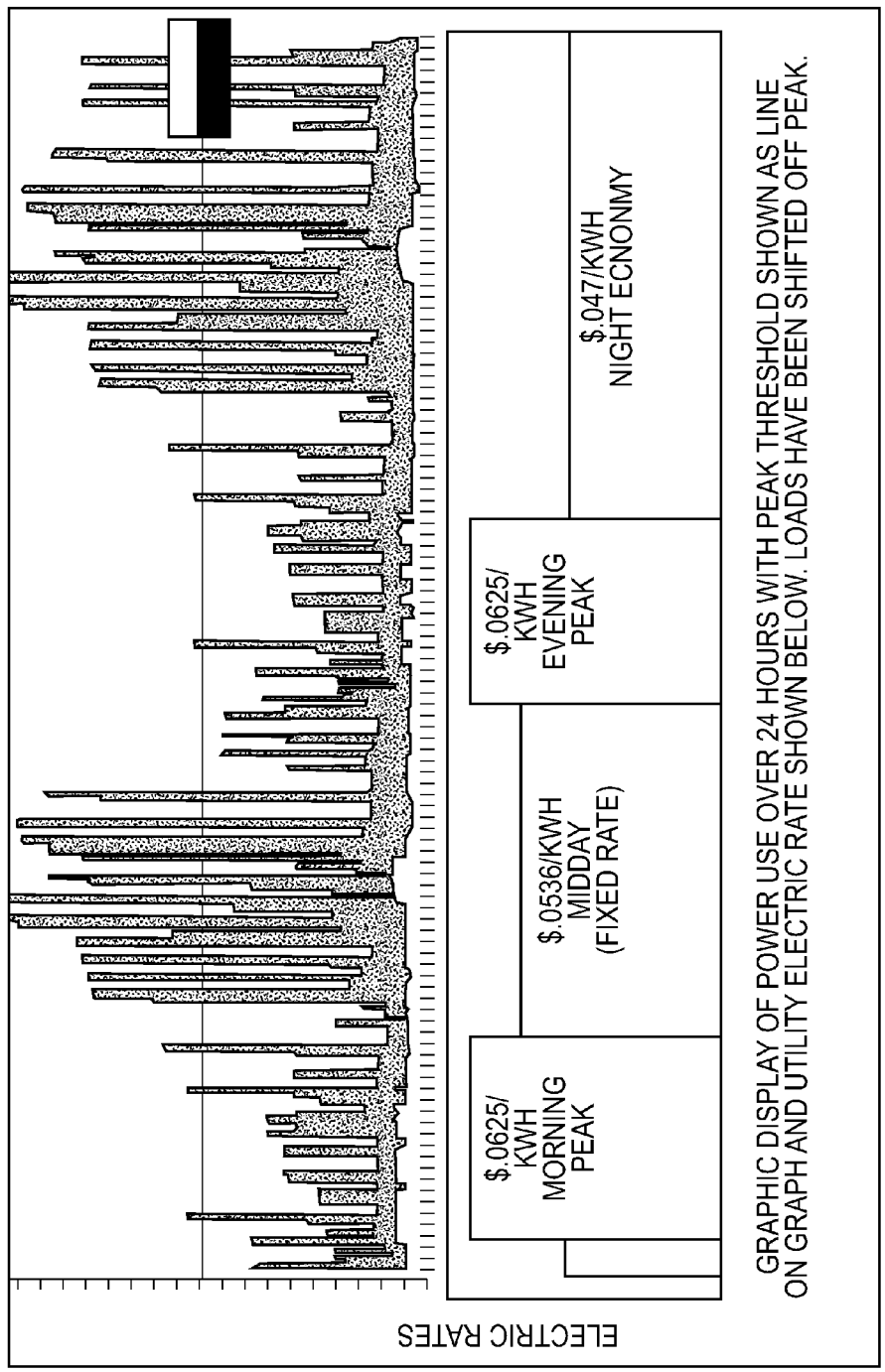
FIG. 18 is a graphical representation of a utility-rate overlap graph displayed by the resident software of the system in accordance with the present invention.

In yet even more preferred or alternative modifications to any of the preceding resident software and elements thereof, as may be comprehended with reference now also to FIGS. 16, 17, and 18, routines may be incorporated that enable and contemplate numerous graphical display capabilities that may be arranged by selected periods of time (FIG. 16), that enable review and comparison of power consumption of an entire building or facility with individual appliances or devices (FIG. 17), and which enable comparison of power consumption per unit time against actual utility supplier rates that may also vary during the overlapping period of time (FIG. 18).

Such utility supplier rates and historical power consumption information such as total kilowatt-hours used gleaned from monthly electric utility supplier invoices or bills may be input via a data entry routine of the resident software as illustrated by the input screens of FIGS. 11 and 12, and which also enables the association of specific devices or appliances with respective main sensor units 12 and/or clip-on sensors 40. Using the information entered from such electric bills, and using the historical power consumption database information, the resident software program may convert the power equivalent units established by the power consumption monitoring system into actual kilowatt hours, a ratio or percent of power consumed by a respectively monitored appliance, an actual total facility cost of power consumed, a cost or cost ratio or cost percentage for an individually monitored appliance or for all monitored appliances, or a cost per kilowatt number as also described elsewhere herein. This will have great prospective benefit for the user, as the user can proactively modify the power consumption profile of the building and/or appliances to conserve power and reduce costs.

The first time that the user inputs information from the electric bill using the software, the conversion from power equivalents to kilowatt hours may have a predictive margin of error of, for example, perhaps approximately 10 percent. However, each time that a user inputs additional information from a new electric bill, the margin of error will be reduced, as the resident software program gains a larger and more statistically robust sample size of historical billings or actual power usage and costs.

The graph of FIG. 18 enables users and consumers to adjust power consumption to periods of time when costs for power are less expensive. In operation, the graphical representation of FIG. 17 illustrates the varying power usage during the course of the selected period of time, which can enable users to identify and adopt power use expectations or baselines of times and durations of operation of equipment or devices, which in turn enables the user to identify unexpectedly operating and/or inefficiently performing appliances, equipment, and devices.

Additional functionality of the resident software and elements and routines thereof may preferably include the capability to send periodic usage data and alarm events or alerts to the user via e-mail, text message, voice mail using a voice response capability, by fax, by remote web server communicating with remote user web-browser applications, and by any other desired communication method. (See, e.g., FIG. 9). Such additional communication capabilities may be of increased significance in the aforementioned special needs situations where it may be important to enable early warning or immediate intervention for those individuals or facilities needing a reliable and uninterrupted supply of electricity. In this way, any anomalous power consumption may be readily identified and redressed. The software may also preferably access and store power consumption usage information pertaining to devices, appliances, homes, and/or businesses having similar profiles to those being monitored so that the user can compare his or her power usage with a typical or comparable power usage profile.

Using various arrangements of the contemplated main sensor units 12, clips 40, monitor units 50 and resident software program routines of the present invention, users may gain information about power consumption in a variety of applications and environments, which enables users to make adjustments and take corrective action regarding possibly inefficient power consumption. For example, the user may have learned over the course of time that an oven in a house usually consumes 40 Power Equivalents when in use, but that it is now consuming significantly more or less, leading to a determination that one of the burner coils is malfunctioning.

In another example, parents may use the system to determine whether their children are using too many electronic devices at one time, such as having a TV, stereo, air conditioner, and computer all in use at the same time, and perhaps unnecessarily. Parents can thus use the system to enable children to manage their power consumption within a predetermined "power budget" for a given period of time such as a week, and can increase or decrease allowance or other incentives to gain cooperation.

INDUSTRIAL APPLICABILITY

The embodiments of the present invention are suitable for use in many applications that involve the requirement to monitor power consumption of residential, commercial, and industrial equipment, appliances, devices, buildings, facilities, and campuses. The various configurations and capabilities of the inventive power consumption monitoring devices, systems, and methods of use can be modified to accommodate nearly any conceivable power consumption monitoring requirement. The arrangement, capability, and compatibility of the features and components of the novel monitoring devices, systems, and methods of use described herein can be readily modified according to the principles of the invention as may be required to suit any particular power supply or power consuming device, or power consumer or user, and can be especially modified to accommodate applications involving individuals and service providers in special needs situations that require a reliable and an uninterrupted supply of electricity.

Such modifications and alternative arrangements may be further preferred and/or optionally desired to establish compatibility with the wide variety of possible applications that are susceptible for use with the inventive and improved power consumption monitoring devices, systems, and monitoring methods that are described and contemplated herein. Accordingly, even though only few such embodiments, alternatives, variations, and modifications of the present invention are described and illustrated, it is to be understood that the practice of such additional modifications and variations and the equivalents thereof, are within the spirit and scope of the invention as defined in the following claims.

I claim:

1. A power consumption monitoring system for monitoring the power transmitted by at least one current-carrying conductor, comprising:
    an amplitude signal generator adapted to produce and communicate an amplitude signal, the amplitude signal generator comprising a passive, open-circuit electromagnetic force concentrator to be positioned proximate and non-ohmically coupled to the at least one current-carrying conductor to measure a micro voltage differential signal generated in the signal generator by a current carried in the measured at least one current-carrying conductor;
    a radio frequency signal generator configured to transmit the amplitude signal; and
    a radio frequency signal monitor adapted to receive and convert (calibrate) the amplitude signal into a scalar signal, the signal monitor including a display showing the scalar signal in a unit of power consumption.

2. The power consumption monitoring system according to claim 1, wherein the radio frequency signal monitor is adapted to collect a plurality of the amplitude signals and to convert (calibrate) the collected plurality of signals into an historical power consumption scalar signal, and wherein the display is configured to show the historical power consumption scalar signal in a unit of power consumption.

3. The power consumption monitoring system according to claim 1, being further adapted to monitor the power transmitted by a plurality of current-carrying conductors, and further comprising: a plurality of the amplitude signal generators each with respective electromagnetic force concentrators for positioning proximate to a respective one of the plurality of current-carrying conductors; a plurality of the radio frequency signal generators each in communication with a respective one of the plurality of signal generators and configured to convert (calibrate) and transmit respective amplitude signals; and wherein the radio frequency signal monitor is adapted to receive and convert (calibrate) each respective amplitude signal into respective scalar signals, the monitor including a display adapted to show the respective scalar signals in units of power consumption.

4. The power consumption monitoring system according to claim 1, further comprising: a radio frequency repeater in communication with the radio frequency signal generator and radio frequency monitor and configured to receive and retransmit the (calibrated) amplitude signal an additional distance; a computer including a storage device and in communication with the radio frequency signal monitor; a software program resident on the computer and being configured to periodically record the scalar signal to an historical database of power consumption information on the storage device; and
wherein the software program accesses power cost information and computes an actual cost of power consumed per unit time using the historical database.

5. The power consumption monitoring system according to claim 1, further comprising: a computer including a memory and in communication with the radio frequency signal monitor; a software program resident on the computer and being configured to record the (calibrated) scalar signal to the memory; and wherein the software program compares at least one predefined alarm condition to the scalar signal and communicates an alarm event if the scalar signal meets the at least one alarm condition.

6. A power consumption monitor for monitoring the power transmitted by at least one current-carrying conductor, comprising:
a current-to-voltage transformer comprising a passive, open-circuit electromagnetic force sensor to be positioned proximate and non-ohmically coupled to the at least one current-carrying conductor, the sensor configured to generate an amplitude signal in proportion to the power being transmitted through the at least one current-carrying conductor;
a first programmable radio on a chip in communication with the current-to-voltage transformer to broadcast the amplitude signal; and
a monitoring device with a second programmable radio on a chip in communication with at least one programmable system on a chip and a display,
wherein the monitoring device receives, converts, calibrates, and displays the amplitude signal as a quantity of power consumption.

7. The power consumption monitor according to claim 6, wherein the monitoring device collects a plurality of the amplitude signals and converts the collected plurality of signals into an historical power consumption quantity to be shown on the display.

8. The power consumption monitor according to claim 6, being adapted to monitor the power transmitted by a plurality of the current-carrying conductors, and further comprising: a plurality of the current-to-voltage transformers each including respective passive, open-circuit electromagnetic force sensors for respective positioning proximate to a respective one of the plurality of current-carrying conductors, each transformer adapted to generate a respective amplitude signal proportional to the power being transmitted through the respective one or a multitude of current-carrying conductors; a plurality of the first programmable radios on a chip each configured to broadcast the respective amplitude signal; a monitoring device that includes a second programmable radio on a chip in communication with at least one programmable system on a chip and a display; and wherein the monitoring device receives, converts (calibrates) each respective amplitude signal for display in units of power consumption.

9. The power consumption monitor according to claim 6, further comprising: a booster module having a third programmable radio on a chip in communication with a third programmable system on a chip adapted to communicate with the first and second programmable radios on a chip to receive (calibrate) and retransmit the (calibrated) amplitude signal an additional distance; a computer including a storage device and in communication with the monitoring device; a software program resident on the computer and being configured to periodically record the (calibrates) amplitude signal to an historical database of power consumption information on the storage device; and wherein the software program accesses power cost information and computes an actual cost of power consumed per unit time using the historical database.

10. The power consumption monitoring system according to claim 6, further comprising: a computer including a memory and in communication with the monitoring device; a software program resident on the computer and being configured to record the (calibrated) amplitude signal to the memory; and wherein the software program compares at least one predefined alarm condition to the amplitude signal and communicates an alarm event if the amplitude signal meets the at least one alarm condition.

11. A power consumption monitor for monitoring the power transmitted by at least one current-carrying conductor, comprising:
an amplitude signal generator configured to produce and communicate an amplitude signal, the amplitude signal generator comprising a passive, open-circuit electromagnetic force concentrator non-ohmically coupled to the at least one current-carrying conductor and passively detecting the electromagnetic force created by electric current flowing in the monitored at least one current-carrying conductor and generating a micro-volt signal, the open circuit voltage differential then being used to convert the differential to an amplitude signal;
a transmitter for transmitting via radio frequency energy, the amplitude signal; and
a receiver for receiving the radio frequency energy containing the amplitude signal and for converting the amplitude signal to a quantity of power consumption and for displaying the quantity.

12. The power consumption monitor according to claim 11, wherein the receiver comprises a collector for collecting a plurality of the amplitude signals and for converting and calibrating the collected plurality of signals into an historical power consumption quantity for display.

13. The power consumption monitor according to claim 11, wherein the power consumption monitor is configured to monitor the power transmitted by a plurality of the current-carrying conductors, and further comprising:
a plurality of the detectors for passively detecting the power being transmitted by the plurality of current-carrying conductors using respective open circuit voltage differentials and for converting the respective voltage differentials to respective amplitude signals; and
a plurality of the transmitters for transmitting via radio frequency energy, the respective amplitude signals; and
a receiver for receiving the respective amplitude signals and for converting the each amplitude signal to a respective quantity of power consumption and for displaying the quantities.

14. The power consumption monitor according to claim 11, further comprising: a another receiver for receiving and for retransmitting the amplitude signal an additional distance to the receiver for receiving the radio frequency energy containing the amplitude signal; a manipulating device for manipulating the amplitude signal that includes a a storage device for storing information and a communication device for communicating with the receiver for receiving the radio frequency energy containing the amplitude signal, wherein the manipulating device for manipulating the amplitude signal includes a recording device configured to periodically record the amplitude signal in an historical database of power consumption information in the storage device for storing information, and wherein the manipulating device for manipulating the amplitude signal comprises a power cost information device to access power cost information and a computing device to compute an actual cost of power consumed per unit time using the historical database.

15. The power consumption monitoring system according to claim 11, further comprising:
   a manipulating device for manipulating the amplitude signal and comprising a storage device for storing information and a communication device for communicating with the receiver for receiving the radio frequency energy containing the amplitude signal,
   wherein the manipulating device for manipulating and calibrating the amplitude signal includes a recording device configure to periodically record the amplitude signal in an historical database of power consumption information in the storage device for storing information, and
   wherein the manipulating device for manipulating the amplitude signal includes a comparing device to compare at least one predefined alarm condition to the amplitude signal and includes a communication device configured to communicate an alarm event if the amplitude signal meets the at least one predefined alarm condition.

16. A power consumption monitoring system for monitoring the power transmitted by at least one current-carrying conductor, comprising:
   a current-to-voltage transformer (CVT) including a passive, open-circuit electromagnetic force (EMF) concentrator to be positioned proximate and non-ohmically coupled to the at least one current-carrying conductor to measure a micro voltage differential signal generated in the current-to-voltage transformer (CVT) by a current carried in the measured at least one current-carrying conductor, the current-to-voltage transformer (CVT) adapted to generate an amplitude signal proportional to the power being transmitted through at least one current-carrying conductor;
   a first programmable radio on chip (PROC) in communication with the current-to-voltage transformer (CVT) and including current-to-voltage (CVT) software resident on the first programmable radio on chip (PROC) operative to convert (calibrate) the amplitude signal to a digital quantity, store the digital quantity, and to periodically transmit the digital quantity; and
   a monitoring device with a second programmable radio on chip (PROC) in communication with at least one PSOC and a display, and including monitoring software resident on the second programmable radio on chip (PROC) operative to periodically communicate with the first programmable radio on chip (PROC) to receive and store the digital quantity and to display the digital quantity on the display in a unit of power consumption.

17. The power consumption monitoring system according to claim 16, wherein the monitoring software is further operative to collect a plurality of the digital quantities and to convert (calibrate) the collected plurality of digital quantities into an historical power consumption quantity to be shown on the display.

18. The power consumption monitor system according to claim 16, being adapted to monitor the power transmitted by a plurality of the current-carrying conductors, and further comprising:
   a plurality of the current-to-voltage transformer (CVT) each including respective passive, open-circuit electromagnetic force (EMF) concentrators for respective positioning proximate to a respective one of the plurality of current-carrying conductor, each current-to-voltage transformer (CVT) adapted to generate a respective amplitude signal proportional to the power being transmitted through the respective one current-carrying conductor;
   a plurality of the first programmable radio on chip (PROC) each configured to convert (calibrate) the respective amplitude signal to a respective digital quantity and to respectively broadcast the digital quantity; and
   a monitoring device that includes a second programmable radio on chip (PROC) in communication with at least one first programmable system on chip (PSOC) and a display,
   wherein the monitoring software receives each respective digital quantity for display in a unit of power consumption.

19. The power consumption monitor according to claim 16, further comprising:
   a booster module including a third programmable radio on chip (PROC) and a third programmable system on chip (PROC) and being in communication with the first programmable radio on chip (PROC) and second programmable radio on chip (PROC) to receive, calibrate and retransmit the amplitude signal an additional distance to the monitoring unit, and including booster software resident on the third programmable system on chip (PROC) operative to calibrate and store the received digital quantity and to periodically retransmit the digital quantity the additional distance to the monitoring unit;
   a computer including a storage device and in communication with the monitoring device; and
   a software program resident on the computer and being configured to periodically record the digital quantity to an historical database of power consumption information on the storage device,
   wherein the software program accesses power cost information and computes an actual cost of power consumed per unit time using the historical database.

20. The power consumption monitoring system according to claim 16, further comprising: a computer including a memory and in communication with the monitoring device; a software program resident on the computer and being configured to record the digital quantity to the memory; and wherein the software program compares at least one predefined alarm condition to the digital quantity and communicates an alarm event if the digital quantity meets the at least one alarm condition.

21. A method for monitoring power transmitted by at least one current-carrying conductor, comprising the steps of:
   furnishing a current-to-voltage transformer (CVT) including a passive, open-circuit electromagnetic force (EMF) concentrator to be positioned proximate to and non-ohmically coupled to the at least one current-carrying conductor to measure a micro voltage differential signal generated in the current-to-voltage transformer (CVT) by a current carried in the measured at least one current-carrying conductor, the current-to-voltage transformer (CVT) adapted to generate an amplitude signal proportional to the power being transmitted through the at least one current-carrying conductor;

a first programmable radio on chip (PROC) in communication with the current-to-voltage transformer (CVT) to broadcast the amplitude signal, and including current-to-voltage transformer (CVT) software resident on the first programmable radio on chip (PROC) operative to convert (calibrate) the amplitude signal to a digital quantity, store the digital quantity, and to periodically transmit the digital quantity; and a monitoring device with a second programmable radio on chip (PROC) in communication with at least one programmable system on chip (PSOC) and a display, and including monitoring software resident on the second programmable radio on chip (PROC) operative to periodically communicate with the first programmable radio on chip (PROC) to receive and store the digital quantity and to display the digital quantity on the display in a unit of power consumption;

positioning the open-circuit electromagnetic force (EMF) concentrator of the current-to-voltage transformer (CVT) proximate to the at least one current-carrying conductor;

detecting the current being transmitted throug at least one current-carrying conductor and generating the amplitude signal;

converting (calibrating) the amplitude signal to a digital quantity and storing the digital quantity; and receiving in the monitoring device the stored digital quantity from the first PROC and displaying the digital quantity on the display.

22. The method for monitoring power according to claim 21, wherein the monitoring software is further operative to collect a plurality of the digital quantities and to convert (callibrate) the collected plurality of digital quantities into an historical power consumption quantity to be shown on the display, and further comprising the steps of:

collecting with the monitoring software a plurality of the digital quantities;

converting (calibrating) with the monitoring software the collected plurality of digital quantities into an historical power consumption quantity; and showing the historical power consumption quantity on the display.

23. The method for monitoring power according to claim 21, being adapted to monitor the power transmitted by a plurality of the current-carrying conductors, and further comprising the steps of:

furnishing a plurality of the CVTs each including respective passive, open-circuit electromagnetic force concentrators for respective positioning proximate to a respective one of the plurality of current-carrying conductor, each CVT adapted to generate a respective amplitude signal proportional to the power being transmitted through the respective one current-carrying conductor; a plurality of the first PROCs each configured to convert (calibrate) the respective amplitude signal to a respective digital quantity and to respectively broadcast the digital quantity; a monitoring device that includes a second PROC in communication with at least one first PSOC and a display;

and wherein the monitoring software receives each respective digital quantity for display in a unit of power consumption;

positioning each open-circuit EMF concentrator proximate to a respective one of the plurality of current-carrying conductors;

detecting the current being transmitted through each one of the plurality of current-carrying conductors and generating respective amplitude signals;

converting (calibrate) each respective amplitude signal to a respective digital quantity and storing each respective digital quantity; and receiving in the monitoring device each stored digital quantity from each respective first PROC for display.

24. The method for monitoring power according to claim 21, further comprising the steps of:

furnishing a booster module including a third programmable radio on chip (PROC) and a third programmable system on chip (PSOC) and being in communication with the first programmable radio on chip (PROC) and second programmable radio on chip (PROC) to receive calibrate and retransmit the amplitude signal an additional distance to the monitoring unit, and including booster software resident on the third programmable system on chip (PSOC) operative to store the received digital quantity and to periodically retransmit the digital quantity the additional distance to the monitoring unit; a computer including a storage device and in communication with the monitoring device; a software program resident on the computer and being configured to periodically record the digital quantity to an historical database of power consumption information on the storage device; and wherein the software program accesses power cost information and computes an actual cost of power consumed per unit time using the historical database;

receiving in the booster module the digital quantity;

calibrating and storing the digital quantity with the booster software;

transmitting the calibrated digital quantity to the monitoring unit;

receiving the calibrated digital quantity in the monitoring unit;

communicating the calibrated digital quantity from the monitoring unit to the computer; and computing an actual power consumption cost.

25. The method for monitoring power according to claim 21, further comprising the steps of:

furnishing a computer including a memory and in communication with the monitoring device; a software program resident on the computer and being configured to record the digital quantity to the memory; and wherein the software program compares at least one predefined alarm condition to the digital quantity and communicates an alarm event if the digital quantity meets the at least one alarm condition;

receiving the digital quantity in the computer;

comparing the digital quantity to the at least one predefined alarm condition; and communicating an alarm event if the digital quantity meets the at least one alarm condition.

* * * * *